(12) United States Patent
Sato et al.

(10) Patent No.: US 10,541,694 B2
(45) Date of Patent: Jan. 21, 2020

(54) INJECTION-LOCKED PHASE LOCK LOOP CIRCUIT

(71) Applicant: SOCIONEXT INC., Yokohama-shi, Kanagawa (JP)

(72) Inventors: Hajime Sato, Yokohama (JP); Kenta Aruga, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 16/238,092

(22) Filed: Jan. 2, 2019

(65) Prior Publication Data

US 2019/0140651 A1    May 9, 2019

Related U.S. Application Data

(63) Continuation of application No. PCT/JP2016/072018, filed on Jul. 27, 2016.

(51) Int. Cl.
   *H03L 7/095* (2006.01)
   *H03L 7/099* (2006.01)
   *H03L 7/18*  (2006.01)

(52) U.S. Cl.
   CPC ............ *H03L 7/095* (2013.01); *H03L 7/0995* (2013.01); *H03L 7/18* (2013.01); *H03L 2207/06* (2013.01)

(58) Field of Classification Search
   CPC .................................................. H03K 3/0315
   (Continued)

(56) References Cited

U.S. PATENT DOCUMENTS

| 4,201,945 A | 5/1980 | Ohgishi et al. |
| 5,459,766 A | 10/1995 | Huizer et al. |

(Continued)

FOREIGN PATENT DOCUMENTS

| EP | 1742359 A1 | 1/2007 |
| JP | S53-144243 A | 12/1978 |

(Continued)

OTHER PUBLICATIONS

Deng, W., et al., "A 0.048mm$^2$ 3mW Synthesizable Fractional-N PLL with a Soft Injection-Locking Technique", Proceedings of 2015 IEEE International Solid-State Circuits Conference (ISSCC 2015) / Session14/Digital PLLs and SoC Building Blocks/14.1, pp. 252-254, Feb. 24, 2015.

(Continued)

*Primary Examiner* — Adam D Houston
(74) *Attorney, Agent, or Firm* — Arent Fox LLP

(57) ABSTRACT

A PFD outputs a detection signal based on a phase difference or a frequency difference between a reference signal and a feedback signal, a charge pump circuit outputs a pulse signal based on the detection signal, and a loop filter outputs a control voltage based on the pulse signal. A VCO includes a ring oscillator where a plurality of delay element units, which include a plurality of delay elements (for example, inverter circuits) connected in parallel, are connected in series in a ring, controls the frequency of the output signal of the ring oscillator based on the control voltage, and controls the phase of the output signal of the ring oscillator by controlling the active number of delay elements, out of the plurality of delay elements, based on the detection signal. A frequency divider circuit generates and outputs a feedback signal by dividing the frequency of the output signal.

8 Claims, 17 Drawing Sheets

(58) Field of Classification Search
USPC .................. 327/147–149, 156–158
See application file for complete search history.

(56) References Cited

U.S. PATENT DOCUMENTS

| 6,157,691 | A | 12/2000 | Wei | |
|---|---|---|---|---|
| 6,204,694 | B1* | 3/2001 | Sunter | G06F 1/08 |
| | | | | 326/93 |
| 2007/0002993 | A1 | 1/2007 | Wang et al. | |
| 2010/0188158 | A1 | 7/2010 | Ainspan et al. | |
| 2010/0330941 | A1* | 12/2010 | Trikha | H04H 20/57 |
| | | | | 455/180.1 |
| 2013/0222067 | A1 | 8/2013 | Yin et al. | |

FOREIGN PATENT DOCUMENTS

| JP | H05-315899 A | 11/1993 |
|---|---|---|
| JP | H07-095057 A | 4/1995 |
| JP | 3268216 B2 | 3/2002 |
| JP | 2007-013950 A | 1/2007 |
| JP | 2009-117894 A | 5/2009 |
| JP | 2009-177297 A | 8/2009 |
| JP | 2012-516092 A | 7/2012 |
| JP | 2013-179590 A | 9/2013 |
| WO | WO 2010/083920 A1 | 7/2010 |

OTHER PUBLICATIONS

Deng, W, et al., "A 0.0066mm$^2$ 780μW Fully Synthesizable PLL with a Current-Output DAC and an Interpolative Phase-Coupled Oscillator Using Edge-Injection Technique", Proceedings of 2014 IEEEInternational Solid-State Circuits Conference (ISSCC 2014)/Session15/Digital PLLs/15.1, pp. 266-268, Feb. 11, 2014.

International Search Report of related International Patent Application No. PCT/JP2016/072018 dated Oct. 18, 2016.

Written Opinion of the International Searching Authority of related International Patent Application No. PCT/JP2016/072018, with partial translation of Box No. V, dated Oct. 18, 2016.

* cited by examiner

INJECTION-LOCKED PHASE LOCK LOOP CIRCUIT

CROSS-REFERENCE TO RELATED APPLICATION

This application is a continuation application of International Application PCT/JP2016/072018 filed on Jul. 27, 2016 which designated the U.S., the entire contents of which are incorporated herein by reference.

FIELD

The embodiments discussed herein are related to an injection-locked phase lock loop circuit.

BACKGROUND

An injection-locked PLL (phase lock loop) circuit is known as one type of PLL circuit. A voltage-controlled oscillator circuit of an injection-locked PLL circuit has a phase control function in addition to a frequency control function. A voltage-controlled oscillator circuit is supplied with a control voltage that has been generated by a charge pump and a loop filter based on a signal indicating a phase difference or frequency difference between a reference signal and a feedback signal. The frequency of an output signal of the voltage-controlled oscillator circuit is then controlled based on the control voltage. An injection signal based on a reference signal (for example, a clock signal of a predetermined frequency) is supplied to the voltage-controlled oscillator circuit, and phase control of the output signal is performed so as to be synchronized with the reference signal.

Note that when a delay circuit is used during generation of a pulse signal based on a reference signal as an injection signal, the pulse width becomes more easily affected by the power supply voltage, process fluctuations, and the like, making it difficult to achieve an optimum pulse width. For this reason, a technique that uses edges in a reference signal instead of the pulse signal as an injection signal has been proposed.

See, for example, the following documents:
Japanese Laid-open Patent Publication No. 07-95057;
Japanese Laid-open Patent Publication No. 2009-177297;
Japanese Patent No. 3,268,216;
Japanese Laid-open Patent Publication No. 2009-117894;
Japanese Laid-open Patent Publication No. 05-315899; and
W. Deng, D. Yang, A. Narayanan, K. Nakata, T. Siriburanon, K. Okada, and A. Matsuzawa, "A 0.048-mm² 3-mW Synthesizable Fractional-N PLL with a Soft Injection-Locking Technique", IEEE International Solid-State Circuits Conference (ISSCC), 2015.

However, in a conventional injection-locked PLL circuit, when the output signal of the voltage-controlled oscillator circuit is injected before the frequency sufficiently converges, convergence of the frequency itself becomes difficult. This causes a need for processing, such as control for determining whether the frequency of the output signal has converged, as initialization processing in readiness for phase control, which makes phase control difficult.

SUMMARY

According to an aspect, there is provided an injection-locked phase lock loop (PLL) circuit including: a phase frequency detector circuit that outputs a detection signal based on a phase difference or a frequency difference between a reference signal and a feedback signal; a charge pump circuit that outputs a pulse signal based on the detection signal; a loop filter that outputs a control voltage based on the pulse signal; a voltage-controlled oscillator circuit that includes a ring oscillator, in which a plurality of delay element units including a plurality of delay elements connected in parallel are connected in series in a ring, that controls a frequency of an output signal of the ring oscillator based on the control voltage, and that controls a phase of the output signal by controlling an active number of the delay elements out of the plurality of delay elements based on the detection signal; and a frequency divider circuit that divides the output signal to generate the feedback signal and outputs the feedback signal.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
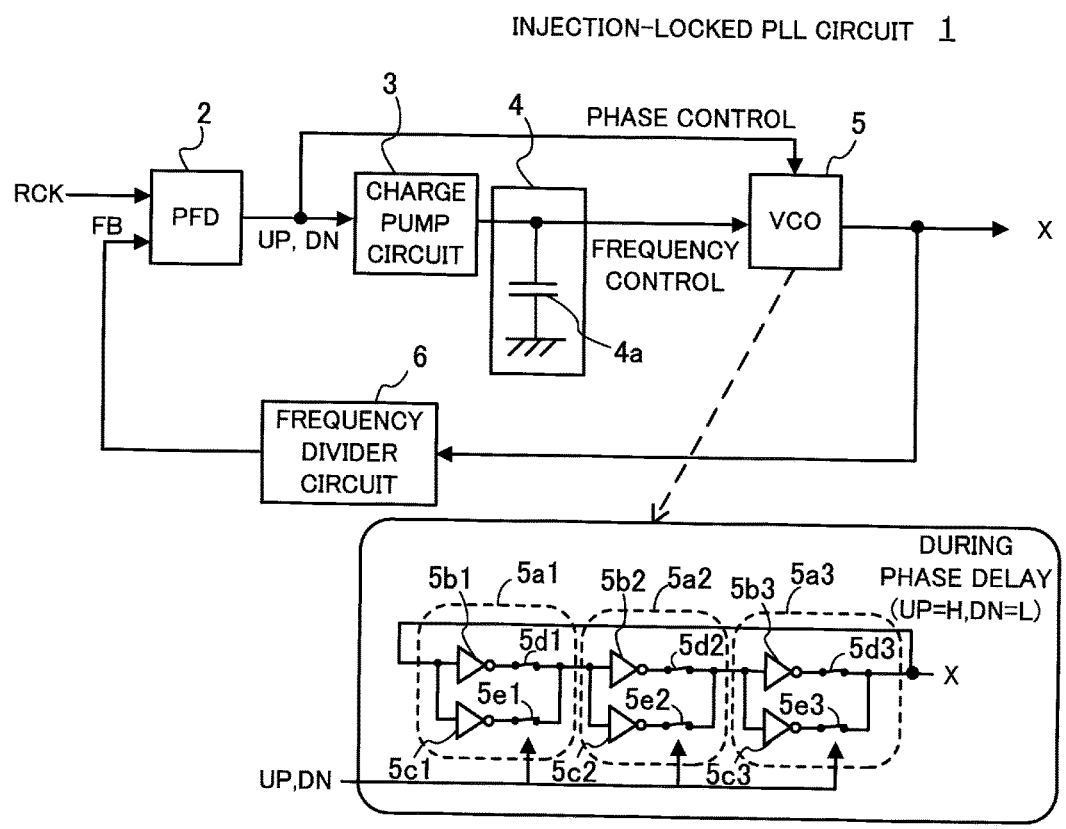
FIG. 1 depicts one example of an injection-locked PLL circuit according to a first embodiment.

Several embodiments will be described below with reference to the accompanying drawings, wherein like reference numerals refer to like elements throughout.

First Embodiment

FIG. 1 depicts one example of an injection-locked PLL circuit according to a first embodiment.

The injection-locked PLL circuit 1 includes a phase frequency detector circuit (hereinafter "PFD") 2, a charge pump circuit 3, a loop filter 4, a voltage-controlled oscillator circuit (hereinafter "VCO") 5, and a frequency divider circuit 6.

The PFD 2 outputs a detection signal based on the phase difference or the frequency difference between a reference signal RCK and a feedback signal FB. The detection signal includes a signal UP and a signal DN. As one example, when the phase of the feedback signal FB is behind the phase of the reference signal RCK, the PFD 2 sets the logic level of the signal UP at an H (High) level and the logic level of the signal DN at an L (Low) level. When the frequency of the feedback signal FB is lower than the frequency of the reference signal RCK, the number of times the logic level of the signal DN becomes the H level is greater than the number of times the signal DN becomes the L level. When the frequency of the feedback signal FB is higher than the frequency of the reference signal RCK, the number of times the logic level of the signal DN becomes the L level is greater than the number of times the signal DN becomes the H level.

The charge pump circuit 3 outputs a pulse signal (or "current pulses") based on the detection signal outputted by the PFD 2. As one example, when the logic level of the signal UP is at the H level and the logic level of the signal DN is at the L level, a positive pulse signal is outputted. When the logic level of the signal UP is at the L level and the logic level of the signal DN is at the H level, a negative pulse signal is outputted.

The loop filter 4 generates and outputs a control voltage based on the pulse signal. The loop filter 4 has a capacitor 4a and accumulates the pulse signal outputted from the charge pump circuit 3 to generate and output a control voltage. One end of the capacitor 4a is connected to a line that connects an output terminal of the charge pump circuit 3 and an input terminal of the VCO 5, and the other end of the capacitor 4a is grounded.

The VCO 5 controls the frequency of an output signal X based on the control voltage and also controls the phase of the output signal X based on the detection signal outputted by the PFD 2. That is, the detection signal outputted by the PFD 2 is injected into the VCO 5 in place of the reference signal RCK as an injection signal to be used for phase control.

As depicted in FIG. 1, one example of the VCO 5 has delay element units 5a1, 5a2, and 5a3 that are connected in series in a ring and function as a ring oscillator. In the example in FIG. 1, the delay element unit 5a1 includes switches 5d1 and 5e1 in addition to inverter circuits 5b1 and 5c1 that are delay elements connected in parallel. The delay element unit 5a2 includes switches 5d2 and 5e2 in addition to inverter circuits 5b2 and 5c2 that are connected in parallel. Likewise, the delay element unit 5a3 includes switches 5d3 and 5e3 in addition to inverter circuits 5b3 and 5c3 that are connected in parallel.

The switches 5d1 to 5d3 and 5e1 to 5e3 control the phase of the output signal X by controlling how many out of the inverter circuits 5b1 to 5b3 and 5c1 to 5c3 are to operate (hereinafter referred to as the "active number") based on the detection signal (that is, the signal UP and the signal DN) outputted from the PFD 2.

When the logic levels of the signals UP and DN are at the L level, the switches 5d1 to 5d3 are switched on and the switches 5e1 to 5e3 are switched off. As a result, the inverter circuits 5b1 to 5b3 enter an operating state and the inverter circuits 5c1 to 5c3 enter a non-operating state.

Also, when the logic level of the signal UP is at the H level and the logic level of the signal DN is at the L level, the switches 5d1 to 5d3 and 5e1 to 5e3 are all switched on. As a result, all of the inverter circuits 5b1 to 5b3 and 5c1 to 5c3 enter the operating state. At this time, the frequency of the output signal X is double the frequency when the switches 5d1 to 5d3 are in the on state and the switches 5e1 to 5e3 are in the off state.

When the logic level of the signal UP is at the L level and the logic level of the signal DN is at the H level, the switches 5d1 to 5d3 and 5e1 to 5e3 are all switched off, so that the inverter circuits 5b1 to 5b3 and 5c1 to 5c3 all enter the non-operating state. At this time, the frequency of the output signal X is 0 Hz.

Hereinafter, a state of the VCO 5 where the switches 5d1 to 5d3 are in the on state and the switches 5e1 to 5e3 are in the off state is referred to as "state a", and a state of the VCO 5 where the switches 5d1 to 5d3 and 5e1 to 5e3 are all in the on state is referred to as "state b". The state of the VCO 5 where the switches 5d1 to 5d3 and 5e1 to 5e3 are all in the off state is referred to as "state c".

The frequency divider circuit 6 generates the feedback signal FB by dividing the frequency of the output signal X, and outputs the resulting feedback signal FB. As one example, the frequency divider circuit 6 divides the output signal X by N. By doing so, the output signal X that has a frequency N times the frequency of the reference signal RCK is obtained.

An example operation of the injection-locked PLL circuit 1 according to the first embodiment will now be described.

Figure 2:
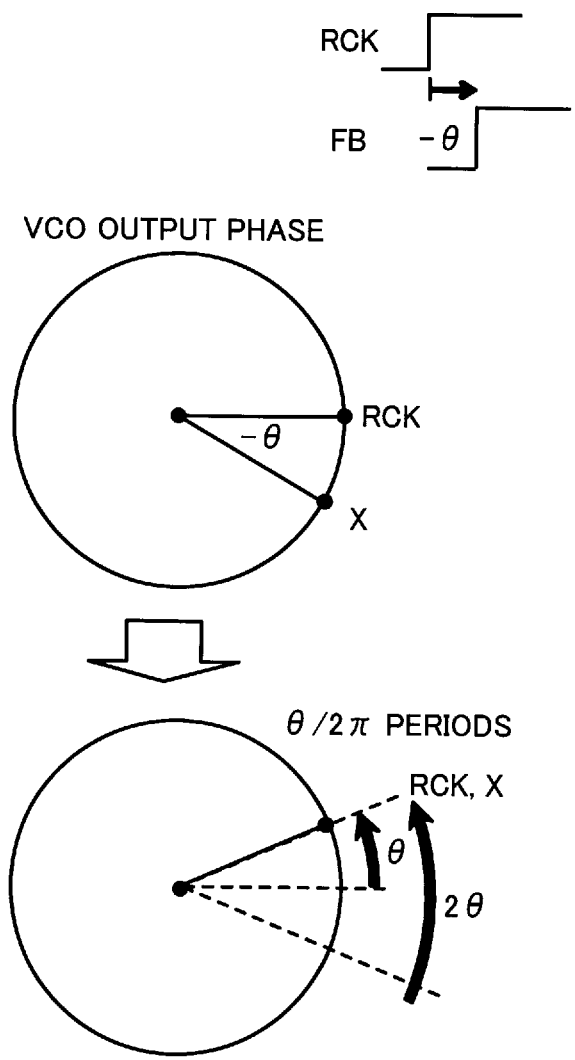
FIG. 2 depicts an example adjustment of an output phase of a VCO when a phase delay has occurred.

FIG. 2 depicts an example adjustment of the output phase of the VCO when a phase delay has occurred.

FIG. 2 depicts an example where a phase delay has occurred so that the phase difference of the feedback signal FB with respect to the reference signal RCK is −θ. At this time, the output phase (that is, the phase of the output signal X) of the VCO 5 is behind the phase of the reference signal RCK by θ.

When a phase delay has occurred as described above, for a certain period the PFD 2 depicted in FIG. 1 changes the logic level of the signal UP from the L level to the H level and keeps the logic level of the signal DN at the L level. At this time, the state of the VCO 5 transitions from state a to state b and the frequency of the output signal X is doubled. By doing so, although the phase of the reference signal RCK changes by θ in θ/2Π periods, the phase of the output signal X changes by 2θ, resulting in the two signals matching. After this, the state of the VCO 5 returns to state a based on the detection signal outputted by the PFD 2.

Figure 3:
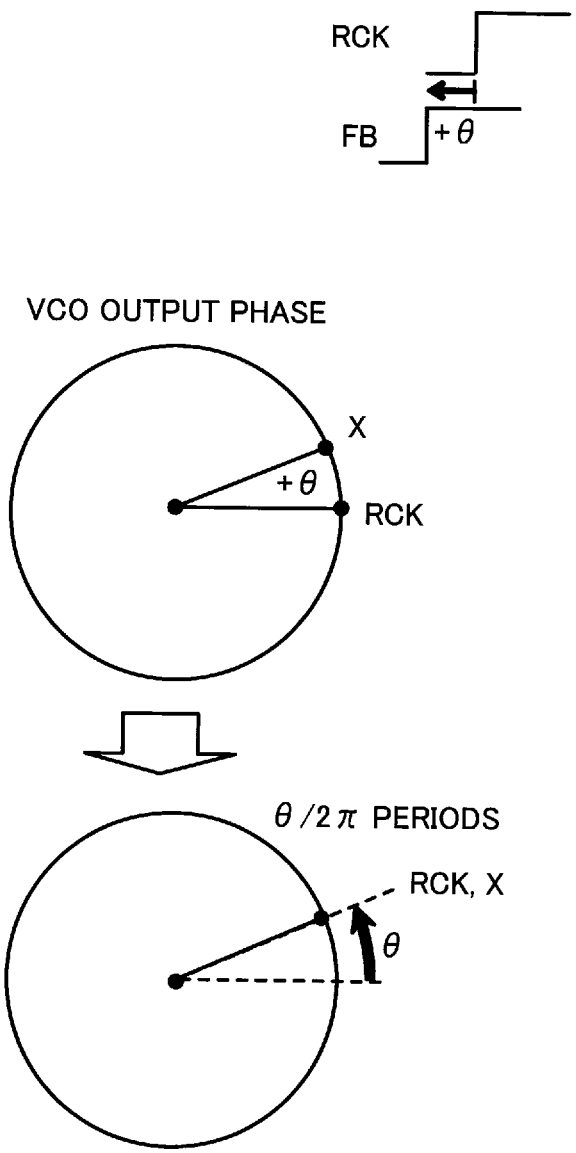
FIG. 3 depicts an example adjustment of the output phase of the VCO when a phase lead has occurred.

FIG. 3 depicts an example adjustment of the output phase of the VCO when a phase lead has occurred.

FIG. 3 depicts an example where a phase lead has occurred so that the phase difference of the feedback signal FB with respect to the reference signal RCK is +θ. At this time, the output phase (that is, the phase of the output signal X) of the VCO 5 is ahead of the phase of the reference signal RCK by θ.

When a phase lead has occurred as described above, for a certain period the PFD 2 depicted in FIG. keeps the logic level of the signal UP at the L level and changes the logic level of the signal DN from the L level to the H level. At this time, the state of the VCO 5 transitions from state a to state c, and the frequency of the output signal X becomes zero. By doing so, although the phase of the reference signal RCK changes by θ in θ/2Π periods, the phase of the output signal X does not change, resulting in the two signals matching. After this, the state of the VCO returns to state a based on the detection signal outputted by the PFD 2.

As described above, the VCO 5 performs phase control of the output signal X based on the detection signal. On the other hand, although not illustrated, the VCO 5 performs frequency control of the output signal X based on the control voltage supplied from the loop filter 4. When the logic level of the signal UP becomes the H level and the logic level of the signal DN becomes the L level more frequently, the frequency at which positive pulse signals occur increases, resulting in an increase in the control voltage. When the control voltage increases, the VCO 5 increases the driving current of the delay element units 5a1 to 5a3 and reduces the delay time at the delay element units 5a1 to 5a3. By doing so, the frequency of the output signal X rises. When the logic level of the signal UP becomes the L level and the logic level of the signal DN becomes the H level more frequently, the frequency at which negative pulse signals occur increases, resulting in a decrease in the control voltage. When the control voltage decreases, the VCO 5 decreases the driving current of the delay element units 5a1 to 5a3 and increases the delay time of the delay element units 5a1 to 5a3. By doing so, the frequency of the output signal X falls.

In the injection-locked PLL circuit 1 described above, the phase of the output signal X is controlled according to the detection signal outputted by the PFD 2 in place of the reference signal RCK as the injection signal of the VCO 5. By doing so, initialization processing, such as determination of convergence of frequency performed when the reference signal RCK is used as the injection signal, becomes unnecessary, making phase control easier.

Also, since phase control is performed by the VCO 5 based on a detection signal, phase jitter is reduced without having to increase the device size to increase the driving current of the VCO 5 to reduce phase noise at the VCO 5. This means that a compact injection-locked PLL circuit 1 with low power consumption is realized.

Second Embodiment

Figure 4:
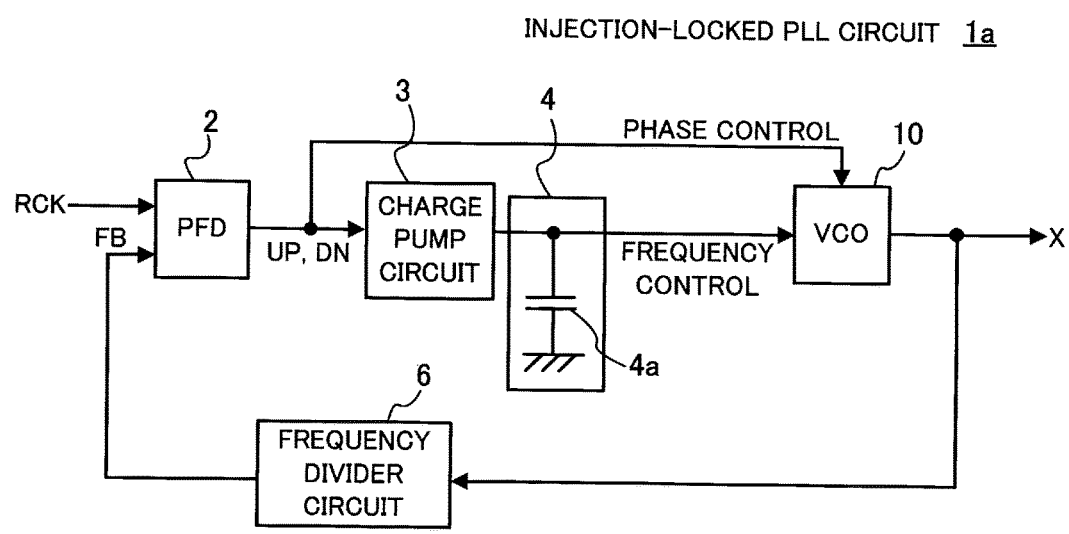
FIG. 4 depicts an example of an injection-locked PLL circuit according to a second embodiment.

FIG. 4 depicts an example of an injection-locked PLL circuit 1 according to a second embodiment. In FIG. 4, elements that are the same as the elements depicted in FIG. 1 have been assigned the same reference numerals.

An injection-locked PLL circuit 1a according to the second embodiment includes a VCO 10 described below.

Figure 5:
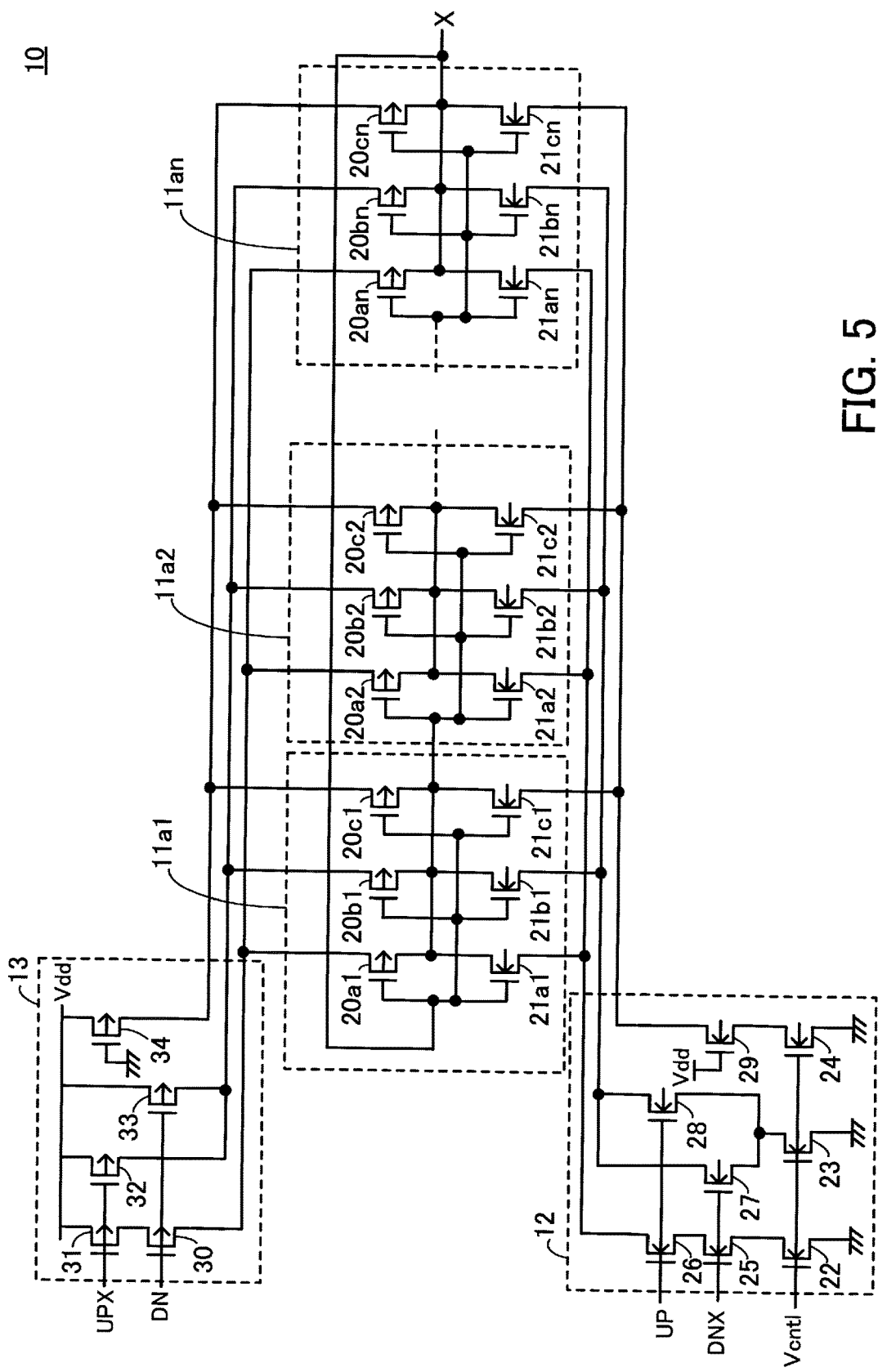
FIG. 5 depicts an example of a VCO of the injection-locked PLL circuit according to the second embodiment.

FIG. 5 depicts an example of a VCO of the injection-locked PLL circuit according to the second embodiment.

The VCO 10 has n delay element units 11a1, 11a2, ... , 11an and switch units 12 and 13.

The delay element units 11a1 to 11an are connected in series in a ring so that an output signal X of the delay element unit 11 an that is the last stage is inputted to the delay element unit 11a1 that is the first stage, and function as a ring oscillator. The delay element units 11a1 to 11an that use inverter circuits as delay elements are described below. In this case, n is an odd number so that an oscillating operation is performed by the ring oscillator. Note that a ring oscillator may be constructed by connecting a plurality of other delay elements (for example, differential amplifiers).

In the example of the VCO 10 according to the second embodiment, each of the delay element units 11a1 to 11an have three inverter circuits that are connected in parallel.

The delay element unit 11a1 includes p-channel type MOSFETs (Metal-Oxide Semiconductor Field Effect Transistors) (hereinafter abbreviated to "pMOS") 20a1, 20b1, and 20c1 and n-channel type MOSFETs (hereinafter abbreviated to "nMOS") 21a1, 21b1 and 21c1. The three inverter circuits mentioned above are realized by the combination of the pMOS 20a1 and the nMOS 21a1, the combination of the pMOS 20b1 and the nMOS 21b1, and the combination of the pMOS 20c1 and the nMOS 21c1.

In the same way, the delay element unit 11a2 includes pMOS 20a2, 20b2, and 20c2 and nMOS 21a2, 21b2, and 21c2. Three inverter circuits are realized by the combination of the pMOS 20a2 and the nMOS 21a2, the combination of the pMOS 20b2 and the nMOS 21b2, and the combination of the pMOS 20c2 and the nMOS 21c2. The delay element unit 11an includes pMOS 20an, 20bn, and 20cn and nMOS 21an, 21bn, and 21cn. Three inverter circuits are realized by the combination of the pMOS 20an and the nMOS 21an, the combination of the pMOS 20bn and the nMOS 21bn, and the combination of the pMOS 20cn and the nMOS 21cn.

The sources (which correspond to the power supply terminals of the inverter circuits) of the pMOS 20a1 to 20an, 20b1 to 20bn, and 20c1 to 20cn are connected to the switch unit 13. The drains (that is, the output terminals of the inverter circuits) of the pMOS 20a1 to 20an, 20b1 to 20bn, and 20c1 to 20cn and the nMOS 21a1 to 21an, 21b1 to 21bn, and 21c1 to 21cn are connected to the input terminals of the three inverter circuits in the next stage. As one example, the drains of the pMOS 20a1, 20b1, and 20c1 are connected to the gates of the pMOS 20a2, 20b2, and 20c2 and the nMOS 21a2, 21b2, and 21c2, which are input terminals of the three inverter circuits of the delay element unit 11a2. The sources (which correspond to the ground terminals of the inverter circuits) of the nMOS 21a1 to 21an, 21b1 to 21bn, and 21c1 to 21cn are connected to the switch unit 12.

The switch unit 12 includes nMOS 22, 23, 24, 25, 26, 27, 28, and 29.

The nMOS 22 is provided on a current path that supplies a current based on a power supply voltage Vdd to the n inverter circuits realized by the pMOS 20a1 to 20an and the nMOS 21a1 to 21an and controls the magnitude of the current based on a control voltage Vcnt1. The nMOS 23 is provided on a current path that supplies a current based on the power supply voltage Vdd to the n inverter circuits realized by the pMOS 20b1 to 20bn and the nMOS 21b1 to 21bn and controls the magnitude of the current based on the control voltage Vcnt1. The nMOS 24 is provided on a current path that supplies a current based on the power supply voltage Vdd to the n inverter circuits realized by the pMOS 20c1 to 20cn and the nMOS 21c1 to 21cn and controls the magnitude of the current based on the control voltage Vcnt1.

The control voltage Vcnt1 is supplied from the loop filter 4 to the gates of the nMOS 22 to 24. The sources of the nMOS 22 to 24 are grounded. The drain of the nMOS 22 is connected to the source of the nMOS 25. The drain of the nMOS 23 is connected to the sources of the nMOS 27 and 28. The drain of the nMOS 24 is connected to the source of the nMOS 29.

The nMOS 25 and 26 are provided on a current path that supplies a current based on the power supply voltage Vdd to the n inverter circuits realized by the pMOS 20a1 to 20an and the nMOS 21a1 to 21an. The nMOS 27 and 28 are provided on a current path that supplies a current based on the power supply voltage Vdd to the n inverter circuits realized by the pMOS 20b1 to 20bn and the nMOS 21b1 to 21bn. The nMOS 29 is provided on a current path that supplies a current based on the power supply voltage Vdd to the n inverter circuits realized by the pMOS 20c1 to 20cn and the nMOS 21c1 to 21cn.

A signal DNX produced by inverting the logic level of the signal DN is supplied to the gates of the nMOS 25 and 27. The drain of the nMOS 25 is connected to the source of the nMOS 26 and the drain of the nMOS 27 is connected to the sources of the nMOS 21b1 to 21bn of the delay element units 11a1 to 11an. A signal UP is supplied to the gates of the nMOS 26 and 28. The drain of the nMOS 26 is connected to the sources of the nMOS 21a1 to 21an of the delay element units 11a1 to 11an. The drain of the nMOS 28 is connected to the sources of the nMOS 21b1 to 21bn of the delay element units 11a1 to 11an.

The power supply voltage Vdd is supplied to the gate of the nMOS 29. The drain of the nMOS 29 is connected to the sources of the nMOS 21c1 to 21cn of the delay element units 11a1 to 11an.

In this way, the nMOS 25 and 26 are connected in series, the nMOS 25 is controlled by the signal DNX, and the nMOS 26 is controlled by the signal UP. The nMOS 27 and 28 are connected in parallel, the nMOS 27 is controlled by the signal DNX, and the nMOS 28 is controlled by the signal UP.

Based on the signals DNX and UP, the nMOS 25 and 26 function as switches that supply or cut off a current based on the power supply voltage Vdd to the n inverter circuits realized by the pMOS 20a1 to 20an and the nMOS 21a1 to 21an. According to this function, the n inverter circuits realized by the pMOS 20a1 to 20an and the nMOS 21a1 to 21an enter an operating state or a non-operating state. Based on the signals DNX and UP, the nMOS 27 and 28 function as switches that supply or cut off a current based on the power supply voltage Vdd to the n inverter circuits realized by the pMOS 20b1 to 20bn and the nMOS 21b1 to 21bn. According to this function, the n inverter circuits realized by the pMOS 20b1 to 20bn and the nMOS 21b1 to 21bn are enter the operating state or the non-operating state.

The switch unit 13 includes pMOS 30, 31, 32, 33, and 34.

The pMOS 30 and 31 are provided on a current path that supplies a current based on the power supply voltage Vdd to the n inverter circuits realized by the pMOS 20a1 to 20an and the nMOS 21a1 to 21an. The pMOS 32 and 33 are provided on a current path that supplies a current based on the power supply voltage Vdd to the n inverter circuits realized by the pMOS 20b1 to 20bn and the nMOS 21b1 to 21bn. The pMOS is provided on a current path that supplies a current based on the power supply voltage Vdd to the n inverter circuits realized by the pMOS 20c1 to 20cn and the nMOS 21c1 to 21cn.

The signal DN is supplied to the gates of the pMOS 30 and 33. The drain of the pMOS 30 is connected to the sources of the pMOS 20a1 to 20an. The source of the pMOS 30 is connected to the drain of the pMOS 31. A signal UPX obtained by inverting the logic level of the signal UP is supplied to the gates of the pMOS 31 and 32. The drains of the pMOS 32 and 33 are connected to the sources of the pMOS 20b1 to 20bn. The gate of the pMOS 34 is grounded. The drain of the pMOS is connected to the sources of the pMOS 20c1 to 20cn. The power supply voltage Vdd is supplied to the sources of the pMOS 31 to 34.

In this way, the pMOS 30 and 31 are connected in series, the pMOS 30 is controlled by the signal DN, and the pMOS 31 is controlled by the signal UPX. The pMOS 32 and 33 are connected in parallel, the pMOS 32 is controlled by the signal UPX, and the pMOS 33 is controlled by the signal DN.

The pMOS 30 and 31 function as switches that supply or cut off, based on the signals DN and UPX, a current based on the power supply voltage Vdd to the n inverter circuits realized by the pMOS 20a1 to 20an and the nMOS 21a1 to 21an. According to this function, the n inverter circuits realized by the pMOS 20a1 to 20an and the nMOS 21a1 to 21an enter the operating state or the non-operating state. The pMOS 32 and 33 function as switches that supply or cut off, based on the signals UPX and DN, a current based on the power supply voltage Vdd to the n inverter circuits realized by the pMOS 20b1 to 20bn and the nMOS 21b1 to 21bn. According to this function, the n inverter circuits realized by the pMOS 20b1 to 20bn and the nMOS 21b1 to 21bn enter the operating state or the non-operating state.

These switch units 12 and 13 realize the same functions as the switches 5d1 to 5d3 and 5e1 to 5e3 depicted in FIG. 1.

However, in the VCO 10 of the injection-locked PLL circuit 1a according to the second embodiment, the nMOS 29 of the switch unit 12 and the pMOS 34 of the switch unit 13 are turned on when the power supply voltage Vdd is supplied. This means that the power supply voltage Vdd is supplied to the sources of the pMOS 20c1 to 20cn, and the sources of the nMOS 21c1 to 21cn are grounded via the nMOS 24 and 29. By doing so, at least one out of the three inverter circuits included in each of the delay element units 11a1 to 11an will be in the operating state irrespective of the signals UP and DN. This means that with the VCO 10, the oscillating state is maintained irrespective of the levels of the signals UP and DN.

When the logic levels of the signals UP and DN are at the L level, at the switch unit 12, the nMOS 25 and 27 are turned on and the nMOS 26 and 28 are turned off. At the switch unit 13, the pMOS 30 and 33 are turned on and the pMOS 31 and 32 are turned off. This means that the power supply voltage Vdd is supplied to the sources of the pMOS 20b1 to 20bn, and the sources of the nMOS 20b1 to 20bn are grounded via the nMOS 23 and 27. By doing so, two out of the three inverter circuits included in each of the delay element units 11a1 to 11an enter the operating state.

When the logic level of the signal UP is at the L level and the logic level of the signal DN is at the H level, at the switch unit 12, the nMOS 25 to 28 are turned off. At the switch unit 13, the pMOS 30 to are turned off. This means that the power supply voltage Vdd is not supplied to the sources of the pMOS 20a1 to 20an and 20b1 to 20bn. By doing so, two of the three inverter circuits included in each of the delay element units 11a1 to 11an enter the non-operating state.

When the logic level of the signal UP is at the H level and the logic level of the signal DN is at the L level, at the switch unit 12, the nMOS 25 to 28 are turned on. At the switch unit 13, the pMOS 30 to are turned on. This means that the power supply voltage Vdd is supplied to the sources of the pMOS 20a1 to 20an and 20b1 to 20bn, and the sources of the nMOS 20a1 to 20an and 20b1 to 20bn are grounded via the nMOS 23, 27, and 28. By doing so, all three inverter circuits included in each of the delay element units 11a1 to 11an enter the operating state.

When the logic levels of the signals UP and DN are at the H level, at the switch unit 12, the nMOS 26 and 28 are turned on and the nMOS 25 and 27 are turned off. At the switch unit 13, the pMOS 31 and 32 are turned on and the pMOS 30 and 33 are turned off. This means that the power supply voltage Vdd is supplied to the sources of the pMOS 20b1 to 20bn, and the sources of the nMOS 20b1 to 20bn are grounded via the nMOS 23 and 28. By doing so, two of the three inverter circuits included in each of the delay element units 11a1 to 11an enter the operating state.

Hereinafter, the state of the VCO 10 when the logic levels of the signals UP and DN are at the L level is referred to as "state A", and the state of the VCO 10 when the logic level of the signal UP is at the L level and the logic level of the signal DN is at the H level is referred to as "state B". The state of the VCO 10 when the logic level of the signal UP is at the H level and the logic level of the signal DN is at the L level is referred to as "state C", and the state of the VCO 10 when the logic levels of the signals UP and DN are at the H level is referred to as "state D".

Since the driving performance of each of the delay element units 11a1 to 11an increases as the active number of inverter circuits in each of the delay element units 11a1 to 11an increases, the frequency of the output signal X of the VCO 10 (or "oscillation frequency" of the VCO 10) rises.

The frequency of the output signal X in state B where one inverter circuit operates in each of the delay element units 11a1 to 11an is 0.5 times the frequency in states A and D where two inverter circuits operate. The frequency of the output signal X in state C where three inverter circuits operate in each of the delay element units 11a1 to 11an is 1.5 times the frequency in states A and D where two inverter circuits operate.

In the injection-locked PLL circuit 1a according to the second embodiment, phase control is performed over the output signal X of the VCO 10 by switching between states A to D according to the phase difference between the reference signal RCK and the feedback signal FB.

In addition, the frequency of the output signal X is controlled according to the control voltage Vcnt1. When the frequency of the feedback signal FB is lower than the frequency of the reference signal RCK, the logic level of the signal DN becomes the L level with the logic level of the signal UP at the H level more frequently. At this time, the control voltage Vcnt1 increases, the drain currents of the nMOS 22 to 24 of the switch unit 12 increase, and the driving currents of the delay element units 11a1 to 11an increase, so that the delay time decreases and the frequency of the output signal X rises. When the frequency of the feedback signal FB is higher than the frequency of the reference signal RCK, the logic level of the signal DN becomes the H level with the logic level of the signal UP is at the L level more frequently. At this time, the control voltage Vcnt1 decreases, the drain currents of the nMOS 22 to 24 of the switch unit 12 decrease, and the driving currents of the delay element units 11a1 to 11an decrease, so that the delay time increases and the frequency of the output signal X falls.

One example of the PFD 2 that outputs the signals UP and DN described above is described below.

Example of PFD 2

Figure 6:
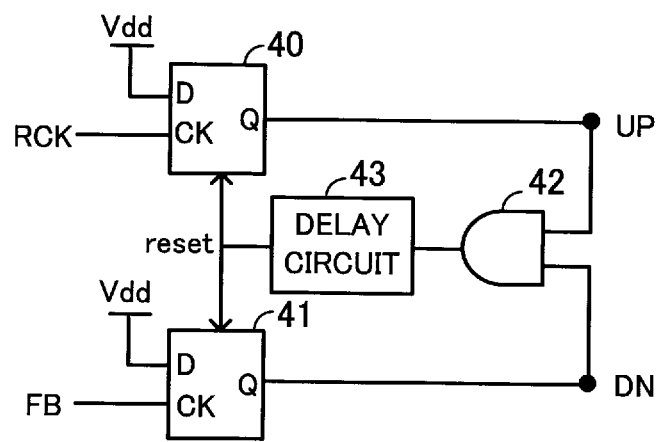
FIG. 6 depicts an example of a PFD.

FIG. 6 depicts one example of a PFD.

The PFD 2 includes flip-flops 40 and 41, an AND circuit 42, and a delay circuit 43.

The power supply voltage Vdd is supplied to data input terminals (labeled "D") of the flip-flops 40 and 41. The reference signal RCK is supplied to a clock terminal (labeled "CK") of the flip-flop 40, and a feedback signal FB is supplied to a clock terminal of the flip-flop 41. The signal UP is outputted from an output terminal (labeled "Q") of the flip-flop 40 and the signal DN is outputted from an output terminal of the flip-flop 41.

When the logic level of the reference signal RCK rises from the L level to the H level, the flip-flop 40 outputs an output signal whose logic level is at the H level. When the logic level of the feedback signal FB rises from the L level to the H level, the flip-flop 41 outputs an output signal whose logic level is at the H level. The flip-flops 40 and are reset to the L level when the logic level of the output signal of the delay circuit 43 becomes the H level.

The AND circuit 42 outputs a logical AND for the signal UP and the signal DN.

The delay circuit 43 delays the output signal of the AND circuit 42 by a predetermined time.

Note that the PFD 2 may have two inverter circuits that invert the logic levels of the signals UP and DN in order to generate the signals UPX and DNX mentioned earlier. These two inverter circuits may be provided in the VCO 10.

Figure 7:
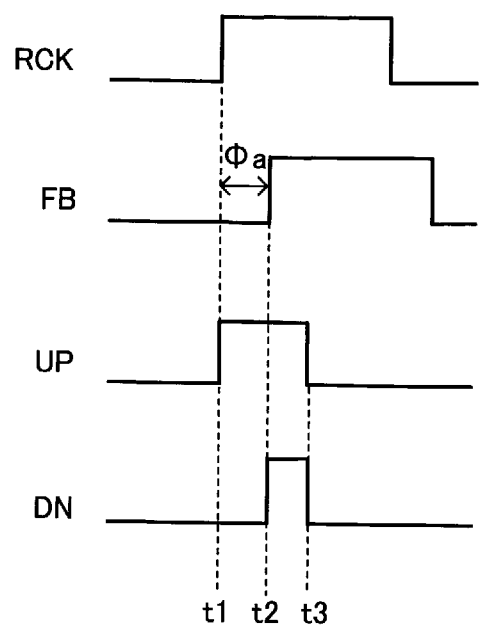
FIG. 7 is a timing chart depicting examples of signals UP and DN outputted when a phase of a feedback signal FB is behind a phase of a reference signal RCK.

FIG. 7 is a timing chart depicting examples of the signals UP and DN outputted when the phase of the feedback signal FB is behind the phase of the reference signal RCK.

FIG. 7 depicts an example where the phase of the feedback signal FB is a phase difference Φa behind the phase of the reference signal RCK.

When, in a state where the logic levels of the reference signal RCK, the feedback signal FB, and the signals UP and DN are all at the L level, the logic level of the reference signal RCK rises to the H level (at timing t1), the logic level of the signal UP outputted from the output terminal of the flip-flop 40 becomes the H level. At this time, since the logic level of the signal DN outputted from the output terminal of the flip-flop 41 remains at the L level, the logic level of the output signal of the AND circuit 42 remains at the L level.

When the logic level of the feedback signal FB rises to the H level (at timing t2), the logic level of the signal DN outputted from the output terminal of the flip-flop 41 becomes the H level. As a result, the logic level of the output signal of the AND circuit 42 becomes the H level, and the logic level of the output signal of the delay circuit 43 also becomes the H level after the predetermined time. When the logic level of the output signal of the delay circuit 43 becomes the H level, the logic levels of the output signals outputted from the output terminal of the flip-flops 40, 41 are reset to the L level (at timing t3).

Figure 8:
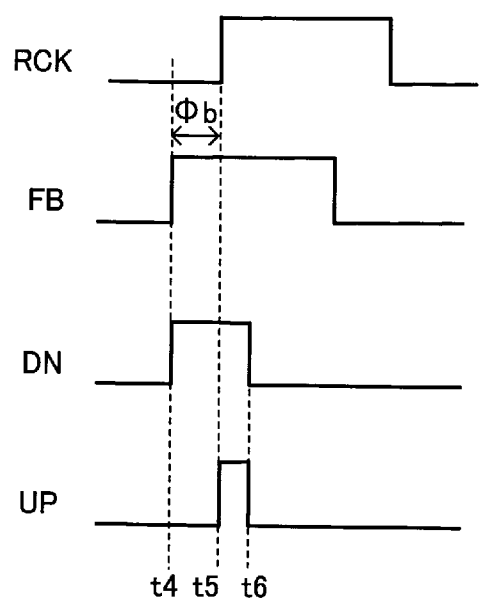
FIG. 8 is a timing chart depicting examples of the signals UP and DN outputted when the phase of the feedback signal FB is ahead of the phase of the reference signal RCK.

FIG. 8 is a timing chart depicting examples of the signals UP and DN outputted when the phase of the feedback signal FB is ahead of the phase of the reference signal RCK.

FIG. 8 depicts an example where the phase of the feedback signal FB is a phase difference Φb ahead of the phase of the reference signal RCK.

When, in a state where the logic levels of the reference signal RCK, the feedback signal FB, the signals UP and DN are all at the L level, the logic level of the feedback signal FB rises to the H level (at timing t4), the logic level of the signal DN outputted from the output terminal of the flip-flop 41 becomes the H level. At this time, since the logic level of the signal UP outputted from the output terminal of the flip-flop 40 remains at the L level, the logic level of the output signal of the AND circuit 42 remains at the L level.

When the logic level of the reference signal RCK rises to the H level (at timing t5), the logic level of the signal UP outputted from the output terminal of the flip-flop 40 becomes the H level. As a result, the logic level of the output signal of the AND circuit 42 becomes the H level, and the logic level of the output signal of the delay circuit 43 also becomes the H level after the predetermined time. When the logic level of the output signal of the delay circuit 43 becomes the H level, the logic levels of the output signals outputted from the output terminals of the flip-flops 40 and 41 are reset to the L level (at timing t6).

In FIGS. 7 and 8, the smaller the phase difference between the reference signal RCK and the feedback signal FB, the shorter the period from timing t1 to t2 and the period from timing t4 to t5.

By precisely switching the active number of the inverter circuits in short periods like those described above, the switch units 12 and 13 described earlier are capable of accurate phase control.

The nMOS 25 and 26 and pMOS 30 and 31 in the switch units 12 and 13 are used as switches that increase the active number of inverter circuits in each of the delay element units 11a1 to 11an by one for only the time period from timing t1 to t2 which corresponds to the phase difference Φa.

The nMOS 27 and 28 and pMOS 32 and 33 in the switch units 12 and 13 are used as switches that decrease the active number of inverter circuits in each of the delay element units 11a1 to 11an by one for only the time period from timing t4 to t5 which corresponds to the phase difference Φb.

Figure 9:
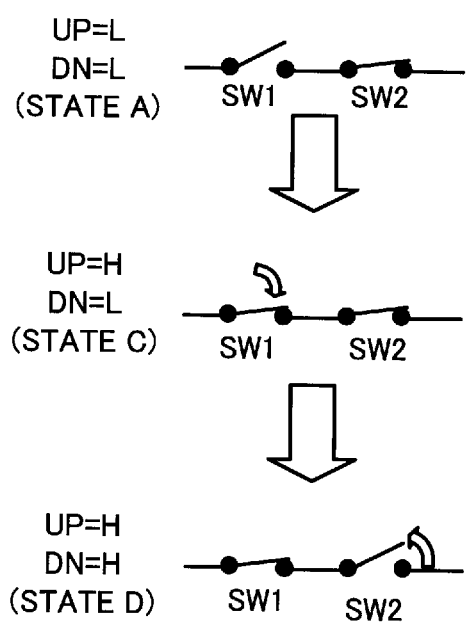
FIG. 9 depicts an example operation of switches when an active number of inverter circuits is increased for a short period.

FIG. 9 depicts an example operation of the switches when the active number of inverter circuits is increased for a short period.

A switch SW1 corresponds to the nMOS 26 of the switch unit 12 (or the pMOS 31 of the switch unit 13), and a switch SW2 corresponds to the nMOS 25 of the switch unit 12 (or the pMOS 30 of the switch unit 13).

When the logic levels of the signals UP and DN are at the L level (that is, when the VCO 10 is in state A), the switch SW1 is off and the switch SW2 is on.

When the logic level of the signal UP becomes the H level (that is, when the VCO 10 transitions to state C) like at timing t1 in FIG. 7, both switches SW1 and SW2 are switched on as depicted in FIG. 9. As a result, the active number of inverter circuits in each of the delay element units 11a1 to 11an increases by one. That is, n inverter circuits realized by the pMOS 20a1 to 20an and the nMOS 21a1 to 21an enter the operating state.

When the logic level of the signal DN also becomes the H level (that is, when the VCO 10 transitions to state D) like at timing t2 in FIG. 7, as depicted in FIG. 9, the switch SW1 remains on and the switch SW2 is switched off. As a result, the active number of inverter circuits in each of the delay element units 11a1 to 11an returns to the active number in state A (that is, two). That is, n inverter circuits realized by the pMOS 20a1 to 20an and the nMOS 21a1 to 21an enter the non-operating state.

Figure 10:
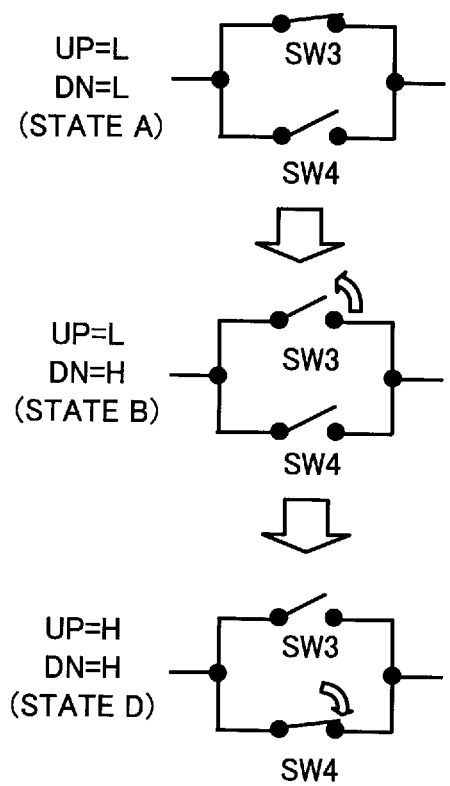
FIG. 10 depicts an example operation of the switches when the active number of inverter circuits is decreased for a short period.

FIG. 10 depicts an example operation of the switches when the active number of inverter circuits is decreased for a short period.

A switch SW3 corresponds to the nMOS 27 of the switch unit 12 (or the pMOS 33 of the switch unit 13) and a switch SW4 corresponds to the nMOS 28 of the switch unit 12 (or the pMOS 32 of the switch unit 13).

When the logic levels of the signals UP and DN are at the L level (that is, when the VCO 10 is in state A), the switch SW3 is switched on and the switch SW4 is switched off. As a result, the n inverter circuits of the delay element units 11a1 to 11an, which are realized by the pMOS 20b1 to 20bn and the nMOS 21b1 to 21bn, enter the operating state.

When the logic level of the signal DN becomes the H level (that is, when the VCO 10 transitions to state B) like at timing t4 in FIG. 8, both switches SW3 and SW4 are switched off as depicted in FIG. 10. As a result, the active number of inverter circuits in each of the delay element units 11a1 to 11an decreases by one. That is, n inverter circuits realized by the pMOS 20b1 to 20bn and the nMOS 21b1 to 21bn enter the non-operating state.

When the logic level of the signal UP also becomes the H level (that is, when the VCO 10 transitions to state D) like at timing t5 in FIG. 8, as depicted in FIG. 10, the switch SW3 remains off and the switch SW4 is switched on. As a result, the active number of inverter circuits in each of the delay element units 11a1 to 11an returns to the active number in state A (that is, two). That is, n inverter circuits realized by the pMOS 20b1 to 20bn and the nMOS 21b1 to 21bn enter the operating state.

As described above, the VCO 10 controls each of the switches SW1 and SW2, which are connected in series, based on the different signals UP and DN, and controls the switches SW3 and SW4, which are connected in parallel, based on the different signals UP and DN. By doing so, even when the phase differences Φa and Φb are minute, it is possible to control switching of the active number of inverter circuits in each of the delay element units 11a1 to 11an for a short period, so that phase control is performed accurately.

The injection-locked PLL circuit 1a according to the second embodiment has the same effects as the injection-locked PLL circuit 1 according to the first embodiment.

Note that although the delay element units 11a1 to 11an of the VCO 10 each have three inverter circuits, the present embodiment is not limited to this. It is possible to increase the number of inverter circuits that enter the operating state for a short time, to increase the number of switches corresponding to this, to increase the number of inverter circuits that enter the non-operating state for a short time, and to increase the number of switches corresponding to this.

In place of the VCO 10 depicted in FIG. 5, it is also possible to use the VCO described below.

First Alternative Example of VCO

Figure 11:
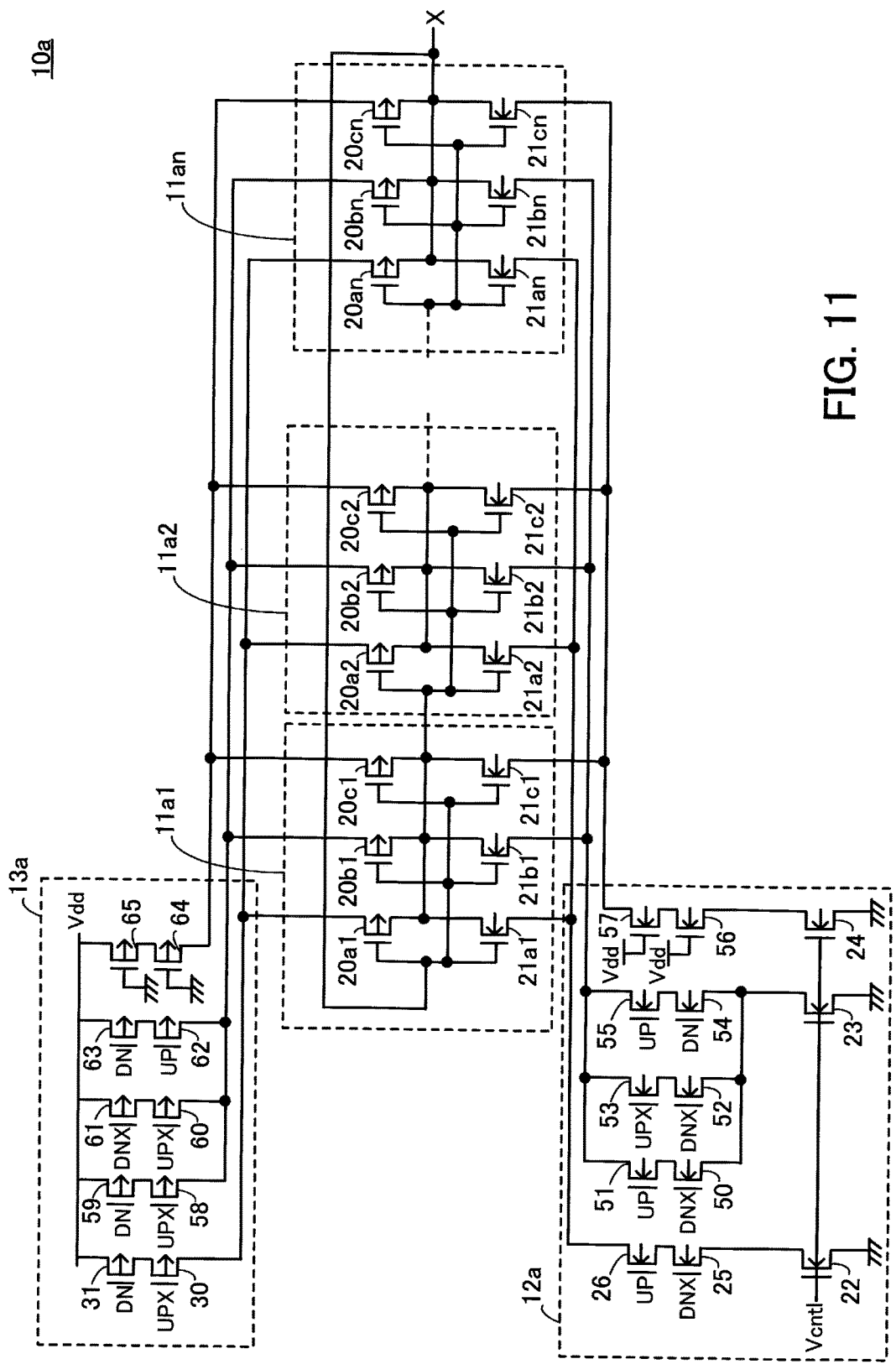
FIG. 11 depicts a first alternative example of a VCO.

FIG. 11 depicts another example of a VCO. In FIG. 11, elements that are the same as the elements of the VCO 10 depicted in FIG. 5 have been assigned the same reference numerals.

In the VCO 10a depicted in FIG. 11, switch units 12a and 13a differ to the switch units 12 and 13 of the VCO 10 depicted in FIG. 5.

The switch unit 12a of the VCO 10a includes nMOS 50, 51, 52, 53, 54, and 55.

The sources of the nMOS 50, 52, and 54 are connected to the drain of the nMOS 23, the signal DNX is supplied to the gates of the nMOS 50 and 52, and the signal DN is supplied to the gate of the nMOS 54. The drain of the nMOS 50 is connected to the source of the nMOS 51, the drain of the nMOS 52 is connected to the source of the nMOS 53, and the drain of the nMOS is connected to the source of the nMOS 55. The signal UP is supplied to the gates of the nMOS 51 and 55, and the signal UPX is supplied to the gate of the nMOS 53. The drains of the nMOS 51, 53, and 55 are connected to the sources of the nMOS 21b1 to 21bn of the delay element units 11a1 to 11an.

In addition, the switch unit 12a of the VCO 10a has nMOS 56 and 57. The source of the nMOS 56 is connected to the drain of the nMOS 24 and the drain of the nMOS 56 is connected to the source of the nMOS 57. The drain of the nMOS 57 is connected to the sources of the nMOS 21c1 to 21cn of the delay element units 11a1 to 11an. The power supply voltage Vdd is supplied to the gates of the nMOS 56 and 57.

The switch unit 13a of the VCO 10a includes pMOS 58, 59, 60, 61, 62, and 63.

The drains of the pMOS 58, 60, and 62 are connected to the sources of the pMOS 20b1 to 20bn of the delay element units 11a1 to 11an. The signal UPX is supplied to the gates of the pMOS 58 and 60, and the signal UP is supplied to the gate of the pMOS 62. The source of the pMOS 58 is connected to the drain of the pMOS 59, the source of the pMOS 60 is connected to the drain of the pMOS 61, and the source of the pMOS is connected to the drain of the pMOS 63. The signal DN is supplied to the gates of the pMOS 59 and 63, and the signal DNX is supplied to the gate of the pMOS 61. The power supply voltage Vdd is supplied to the sources of the pMOS 59, 61, and 63.

The switch unit 13a of the VCO 10a also includes pMOS 64 and 65. The drain of the pMOS 64 is connected to the sources of the pMOS 20c1 to 20cn of the delay element units 11a1 to 11an and the source of the pMOS 64 is connected to the drain of the pMOS 65. The power supply voltage Vdd is supplied to the source of the pMOS 65. The gates of the pMOS 64 and 65 are grounded.

Note that unlike the switch unit 13 in FIG. 5, the signal UPX is supplied to the gate of the pMOS and the signal DN is supplied to the gate of the pMOS 31.

In the VCO 10a, the switch resistances of the current supply paths for the respective inverter circuits are set so as to be equal so that the frequency in state B is exactly 0.5 times and the frequency in state C is exactly 1.5 times the frequency of the output signal X in states A and D.

As one example, when the logic levels of the signals UP and DN are at the L level (that is, when the VCO 10a is in state A), at the switch unit 12a, a current flows to a series circuit composed of the nMOS 52 and 53 and a series circuit composed of the nMOS 56 and 57. At the switch unit 13a, a current flows to a series circuit composed of the pMOS 62 and and a series circuit composed of the pMOS 64 and 65. This means that two inverter circuits operate in each of the delay element units 11a1 to 11an. There are five switches (pMOS or nMOS) in the on state on the current supply path for each inverter circuit that is operating. As one example, the current supply path to the inverter circuit realized by the combination of the pMOS 20b1 and the nMOS 21b1 of the delay element unit 11a1 has the nMOS 23, 52, and 53 and the pMOS 62 and 63. The current supply path to the inverter circuit realized by the combination of the pMOS 20c1 and the nMOS 21c1 has the nMOS 24, 56, and 57 and the pMOS 64 and 65.

When the logic level of the signal UP is at the L level and the logic level of the signal DN is at the H level (that is, when the VCO 10a is in state B), at the switch unit 12a, a current flows to a series circuit composed of the nMOS 56 and 57. At the switch unit 13a, a current flows to a series circuit composed of the pMOS 64 and 65. This means that in each of the delay element units 11a1 to 11an, one inverter circuit connected to the nMOS 57 and the pMOS 64 operates. On the current supply path for each inverter circuit that is operating, there are five switches in the on state described above.

When the logic level of the signal UP is at the H level and the logic level of the signal DN is at the L level (that is, when the VCO 10a is in the state C), at the switch unit 12a, a current flows to a series circuit composed of the nMOS 25 and 26, a series circuit composed of the nMOS 50 and 51, and a series circuit composed of a nMOS 56 and 57. At the switch unit 13a, a current flows to a series circuit composed of the pMOS 30 and 31, a series circuit composed of the pMOS 58 and 59, and a series circuit composed of the pMOS 64 and 65.

This means that three inverter circuits operate in each of the delay element units 11a1 to 11an. In addition, there are five switches in the on-state on the current supply path to each inverter circuit that is operating. As one example, the current supply path to the inverter circuit realized by the combination of the pMOS 20a1 and the nMOS 21a1 of the delay element unit 11a1 has the nMOS 22, 25 and 26 and the pMOS 30 and 31. The current supply path to the inverter circuit realized by the combination of the pMOS 20b1 and the nMOS 21b1 has the nMOS 23, 52, and 53 and the pMOS 58 and 59. The current supply path for the inverter circuit realized by the combination of the pMOS 20c1 and the nMOS 21c1 has the nMOS 24, 56, and 57 and the pMOS 64 and 65.

When the logic levels of the signals UP and DN are at the H level (that is, when the VCO 10a is in state D), at the switch unit 12a, a current flows to the series circuit composed of the nMOS 54 and 55 and the series circuit composed of the nMOS 56 and 57. At the switch unit 13a, a current flows to the series circuit composed of the pMOS 60 and 61 and the series circuit composed of the pMOS 64 and 65. This means that two inverter circuits operate in each of the delay element units 11a1 to 11an. In addition, there are five switches in the on state on the current supply path to each inverter circuit that is operating. As one example, the current supply path for the inverter circuit composed of the combination of the pMOS 20b1 and nMOS 21b1 of the delay element unit 11a1 has the nMOS 23, 54, 55 and the pMOS 60 and 61. The current supply path for the inverter circuit realized by the combination of the pMOS 20c1 and the nMOS 21c1 has the nMOS 24, 56, and 57 and the pMOS 64 and 65.

As described above, in each of states A to D, there are five switches on the current supply path for each inverter circuit that is operating, so that the switch resistance is equal. This makes it possible to set the frequency in state B to exactly 0.5 times and the frequency in state C to exactly 1.5 times the frequency of the output signal X in states A and D, so that phase control is performed more accurately.

Second Alternative Example of VCO

Figure 12:
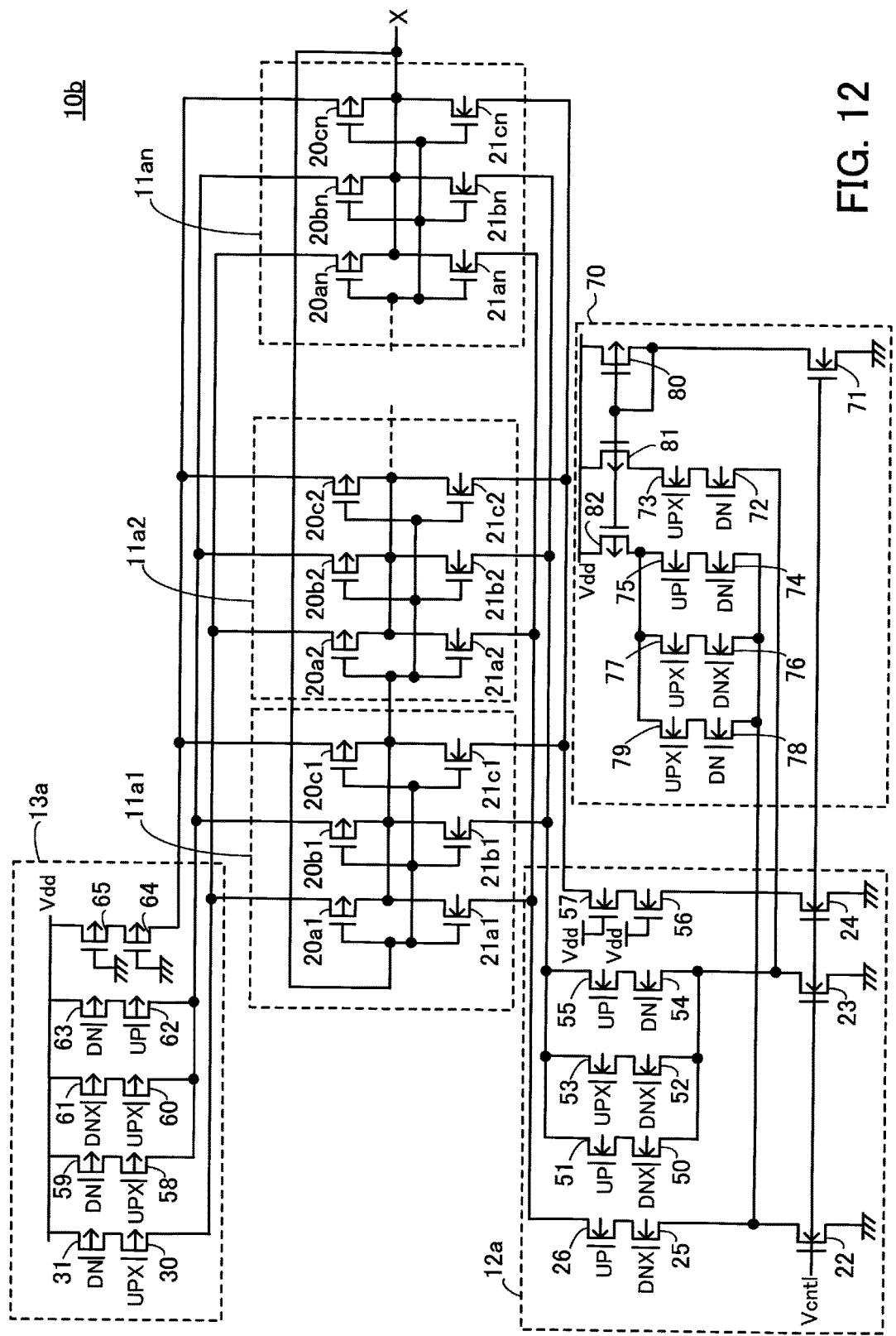
FIG. 12 depicts a second alternative example of a VCO.

FIG. 12 depicts another example of a VCO. In FIG. 12, elements that are the same as the elements of the VCO 10a depicted in FIG. 11 have been assigned the same reference numerals.

A VCO 10b depicted in FIG. 12 differs to the VCO 10 depicted in FIG. 5 by having a current supply circuit 70.

The current supply circuit 70 includes nMOS 71, 72, 73, 74, 75, 76, 77, 78, and 79, and pMOS 80, 81, and 82.

The control voltage Vcnt1 is supplied from the loop filter 4 to the gate of the nMOS 71. The source of the nMOS 71 is grounded. The drain of the nMOS 71 is connected to the drain of the pMOS 80.

The signal DN is supplied to the gate of the nMOS 72. The drain of the nMOS 72 is connected to the source of the nMOS 73, and the source of the nMOS is connected to the drain of the nMOS 23 of the switch unit 12a. The signal UPX is supplied to the gate of the nMOS 73. The drain of the nMOS 73 is connected to the drain of the pMOS 81.

The signal DN is supplied to the gates of the nMOS 74 and 78, and the signal DNX is supplied to the gate of the nMOS 76. The sources of the nMOS 74, 76, and 78 are connected to the drain of the nMOS 22 of the switch unit 12a. The drain of the nMOS 74 is connected to the source of the nMOS 75, the drain of the nMOS 76 is connected to the source of the nMOS 77, and the drain of the nMOS 78 is connected to the source of the nMOS 79.

The signal UP is supplied to the gate of the nMOS 75, and the signal UPX is supplied to the gates of the nMOS 77 and 79. The drains of the nMOS 75, 77, and 79 are connected to the drain of the pMOS 82.

The gates of the pMOS 80 to 82 are connected to each other and are also connected to the drain of the pMOS 80. The power supply voltage Vdd is supplied to the sources of the pMOS 80 to 82.

The current supply circuit 70 functions as a current mirror circuit. The current supply circuit 70 supplies a current with a same magnitude as the current flowing to the series circuit composed of the nMOS 71 and the pMOS 80 to the current path between the nMOS 22 and 25 of the switch unit 12a or the current path between the nMOS 23 and the nMOS 50, 52, and 54.

For example, in states A, B, and D in which at least one of the nMOS 25 and 26 is in the off state, a current flows to any of the series circuit composed of the nMOS 74 and 75, the series circuit composed of the nMOS 76 and 77, and the series circuit composed of the nMOS 78 and 79. This means that a drain current is supplied to the nMOS 22.

In state A where the logic levels of the signals UP and DN are at the L level, since the nMOS 76 and 77 are turned on, a current flows to the series circuit composed of the nMOS 76 and 77 and a drain current is supplied to the nMOS 22. In state B where the logic level of the signal UP is at the L level and the logic level of the signal DN is at the H level, since the nMOS 78 and 79 are turned on, a current flows to the series circuit composed of the nMOS 78 and 79 and a drain current is supplied to the nMOS 22. In state D where the logic levels of the signals UP and DN are at the H level, since the nMOS 74 and 75 are in the ON state, a current flows to the series circuit composed of the nMOS 74 and 75 and a drain current is supplied to the nMOS 22.

In state B in which a current does not flow to any of the series circuits composed of the nMOS 50 and 51, the series circuit composed of the nMOS 52 and 53, and the series circuit composed of the nMOS 54 and 55, the logic level of the signal UP is at the L level and the logic level of the signal DN is at the H level. This means that the nMOS 72 and 73 of the current supply circuit 70 are turned on, a current flows to the series circuit composed of the nMOS 72 and 73, and a drain current is supplied to the nMOS 23.

Even when at least one of the three inverter circuits of the delay element units 11a1 to 11an does not operate as in states A, B and D, a drain current is supplied to the nMOS 22 and 23 by the current supply circuit 70, so that a fall in the drain potential is suppressed. This means that when restarting the operation of an inverter circuit that has stopped operating, it is possible to resume the operation at high speed.

The current supply circuit 70 described above may be provided in the VCO 10 depicted in FIG. 5.

Third Alternative Example of VCO

Figure 13:
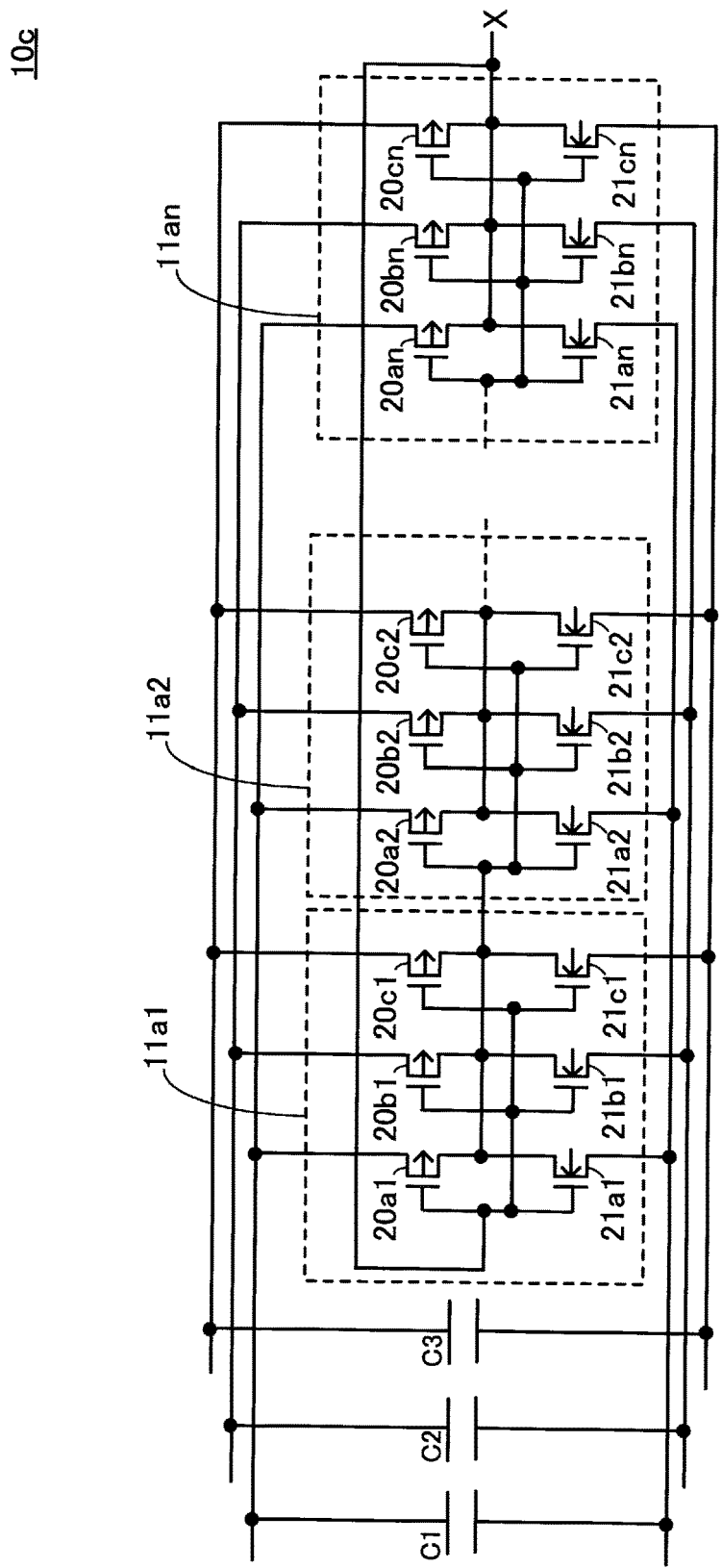
FIG. 13 depicts a third alternative example of a VCO.

FIG. 13 depicts yet another example of a VCO. In FIG. 13, elements that are the same as the elements of the VCO 10 depicted in FIG. 5 have been assigned the same reference numerals. Note that the switch units 12 and 13 of the VCO 10 depicted in FIG. 5 have been omitted from FIG. 13.

A VCO 10c in FIG. 13 includes capacitors C1, C2 and C3.

The capacitor C1 is connected to both ends of each inverter circuit on a current path to the n inverter circuits realized by the pMOS 20a1 to 20an and the nMOS 21a1 to 21an. That is, one end of the capacitor C1 is connected to the sources of the pMOS 20a1 to 20an and the other end is connected to the sources of the nMOS 21a1 to 21an.

The capacitor C2 is connected to both ends of each inverter circuit on a current path to the n inverter circuits realized by the pMOS 20b1 to 20bn and the nMOS 21b1 to 21bn. That is, one end of the capacitor C2 is connected to the sources of the pMOS 20b1 to 20bn and the other end is connected to the sources of the nMOS 21b1 to 21bn.

The capacitor C3 is connected to both ends of each inverter circuit on a current path to the n inverter circuits realized by the pMOS 20c1 to 20cn and the nMOS 21c1 to 21cn. That is, one end of the capacitor C3 is connected to the sources of the pMOS 20c1 to 20cn and the other end is connected to the sources of the nMOS 21c1 to 21cn.

Figure 14:
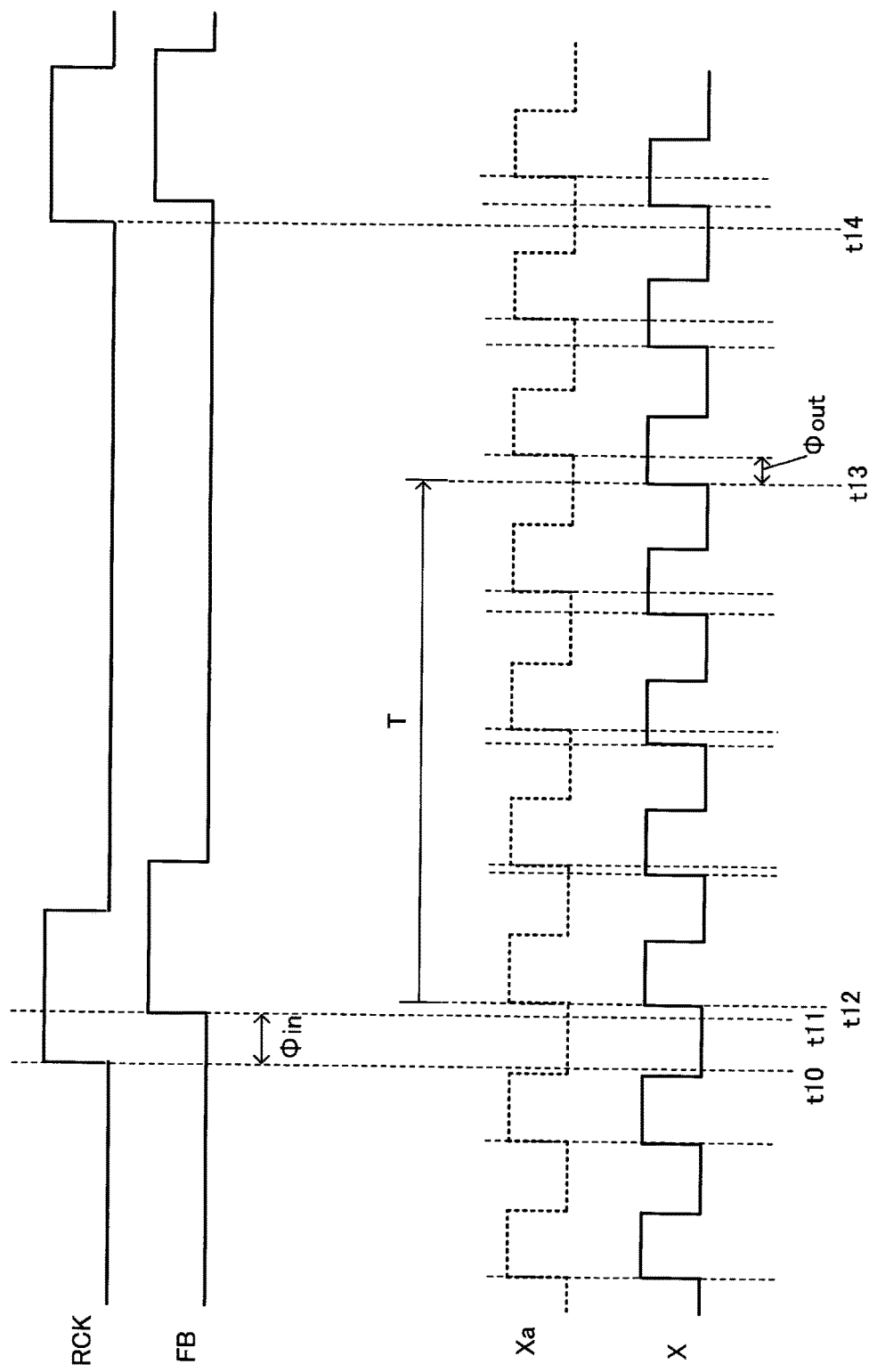
FIG. 14 is a timing chart depicting an example of changes in phase of an output signal of a VCO which includes capacitors.

FIG. 14 is a timing chart depicting an example of changes in phase of the output signal of a VCO which includes capacitors.

FIG. 14 depicts how the phase of the output signal X of the VCO 10c changes when the phase of the feedback signal FB is behind the phase of the reference signal RCK. In FIG. 14, the waveform of a virtual output signal X in which phase changes do not occur is also depicted as the output signal Xa.

In the example in FIG. 14, at timing t10, the logic level of the reference signal RCK rises from the L level to the H level, and after this the logic level of the feedback signal FB rises from the L level to the H level at timing t11. At this time, the phase difference between the reference signal RCK and the feedback signal FB is Φin.

The phase of the output signal X gradually changes due to the influence of the capacitors C1 to C3, and after timing t11, the changes in phase are completed from timing t12, where the logic level of the output signal X first rises from the L level to the H level, until timing t13 a time T later. At timing t13, the phase of the output signal X has advanced by out from the phase of the output signal Xa.

The time T becomes longer as the capacitance values of the capacitors C1 to C3 increase, and it is preferable to set the time T so that the phase change is completed before reaching the next timing (timing t14) at which phase discrimination is performed.

As described above, by providing the capacitors C1 to C3, sudden changes in the phase of the output signal X are suppressed when the active number of inverter circuits is switched according to transitions between states A to D, and there is a reduction in period jitter and reference spurious signals.

Note that the capacitors C1 to C3 may be provided in the VCO 10a depicted FIG. 11 or in the VCO 10b depicted in FIG. 12.

Example of Frequency Overshoot Suppression Circuit

As one example, the frequency overshoot suppression circuit described below is a circuit that suppresses overshoot, which for example may occur before convergence in the change in the frequency of the output signal X following the supplying of the power supply voltage Vdd to the injection-locked PLL circuits 1 and 1a described above.

Figure 15:
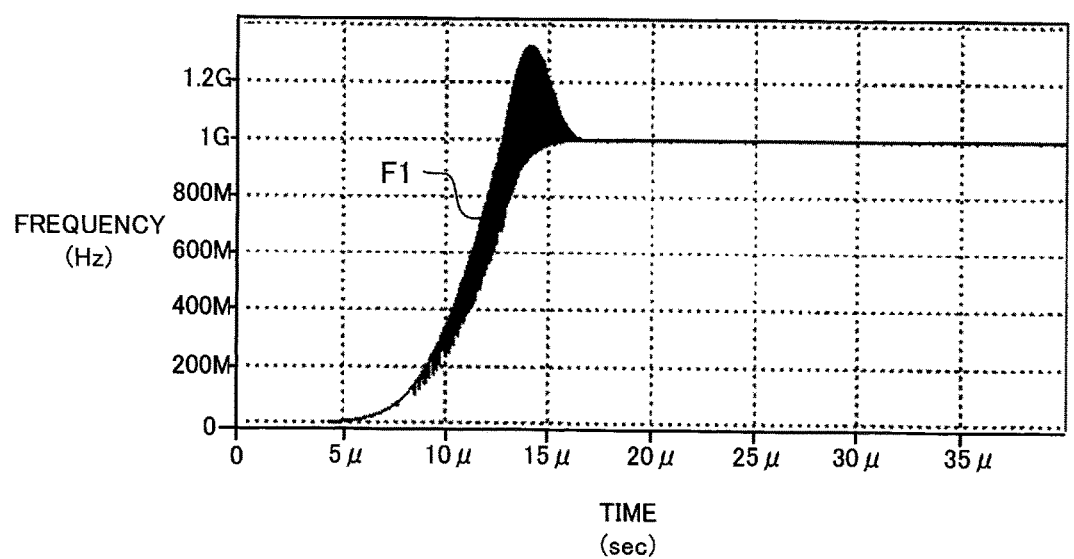
FIG. 15 depicts an example of overshoot.

FIG. 15 depicts an example of overshoot.

The vertical axis represents frequency (in Hz), and the horizontal axis represents time (in sec). The waveform F1 indicates changes in the frequency of the output signal X.

As depicted in FIG. 15, the frequency of the output signal X overshoots to 1.2 GHz or higher before converging at about 1 GHz. When the frequency reached by the overshoot exceeds the maximum operating frequency of the frequency divider circuit 6, the frequency divider circuit 6 may operate incorrectly.

Figure 16:
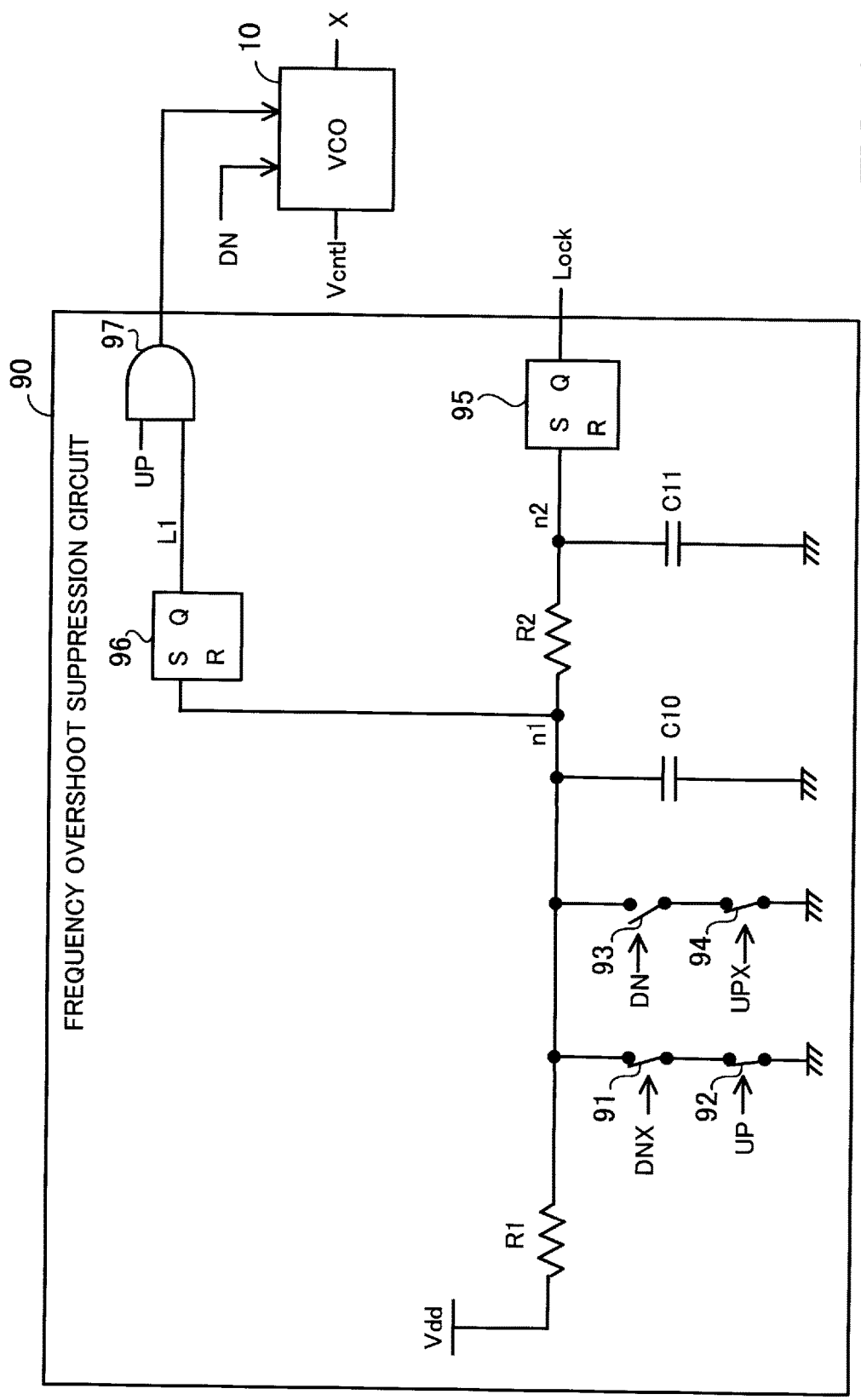
FIG. 16 depicts one example of a frequency overshoot suppression circuit.

FIG. 16 depicts one example of a frequency overshoot suppression circuit.

A frequency overshoot suppression circuit 90 has switches 91, 92, 93, and 94, flip-flops 95 and 96, an AND circuit 97, capacitors C10 and C11, and resistors R1 and R2.

The power supply voltage Vdd is supplied to one end of the resistor R1, and the other end of the resistor R1 is connected to one end of the switches 91 and 93, one end of the capacitor C10, one end of the resistor R2, and a set terminal (labeled as "S") of the flip-flop 96. The other end of the switch 91 is connected to one end of the switch 92, and the other end of the switch 92 is grounded. The other end of the switch 93 is connected to one end of the switch 94, and the other end of the switch 94 is grounded. The other end of the capacitor C10 is grounded.

The switch 91 is switched on when the logic level of the signal DNX is at the H level and is switched off when the logic level is at the L level. The switch 92 is switched on when the logic level of the signal UP is at the H level and is switched off when the logic level is at the L level. The switch 93 is switched on when the logic level of the signal DN is at the H level and is switched off when the logic level is at the L level. The switch 94 is switched on when the logic level of the signal UPX is at the H level and is switched off when the logic level is at the L level.

The switches 91 to 94 are realized by nMOS, for example.

The other end of the resistor R2 is connected to one end of the capacitor C11 and the set terminal of the flip-flop 95. The other end of the capacitor C11 is grounded.

A lock signal Lock is outputted from the output terminal (labeled "Q") of the flip-flop 95. A signal L1 is outputted from the output terminal of the flip-flop 96.

When the held voltage of the capacitor C11 (that is, the potential of the node n2) applied to the set terminal exceeds a threshold value (a value that discriminates between the L level and the H level), the flip-flop 95 outputs a lock signal Lock whose logic level is at the H level. When the held voltage of the capacitor C10 (that is, the potential of the node n1) applied to the set terminal exceeds the threshold value described above, the flip-flop 96 outputs a signal L1 whose logic level is at the H level.

The signal UP is supplied to one input terminal of the AND circuit 97, and the signal L1 is supplied to the other input terminal of the AND circuit 97. The output signal of the AND circuit 97 is supplied to the VCO 10. The AND circuit 97 outputs a logical AND for the signal UP and the signal L1. This means that even when the logic level of the signal UP is at the H level, while the logic level of the signal L1 is at the L level, the logic level of the output signal of the AND circuit 97 supplied to the VCO 10 remains at the L level. That is, the detection signal supplied to the VCO 10 is invalidated.

Note that although FIG. 16 depicts an example that uses the VCO 10, it is also possible to use the VCOs 5, 10a, 10b, and 10c depicted in FIGS. 1, 11, 12, and 13.

In the frequency overshoot suppression circuit 90, when the power supply voltage Vdd is supplied, while the logic levels of the signals UP and DN are at the L level or the logic levels of the signals UP and DN are at the H level (that is, state A or state D), charge is supplied to the capacitors C10 and C11. As a result, the potentials of the nodes n1 and n2 at one end of the capacitors C10 and C11 rise.

When the logic levels of the signals UP and DN are different (state B or state C), both the switches 91 and 92 are switched on or both the switches 93 and 94 are switched on, so that the potentials of the nodes n1 and n2 fall.

Figure 17:
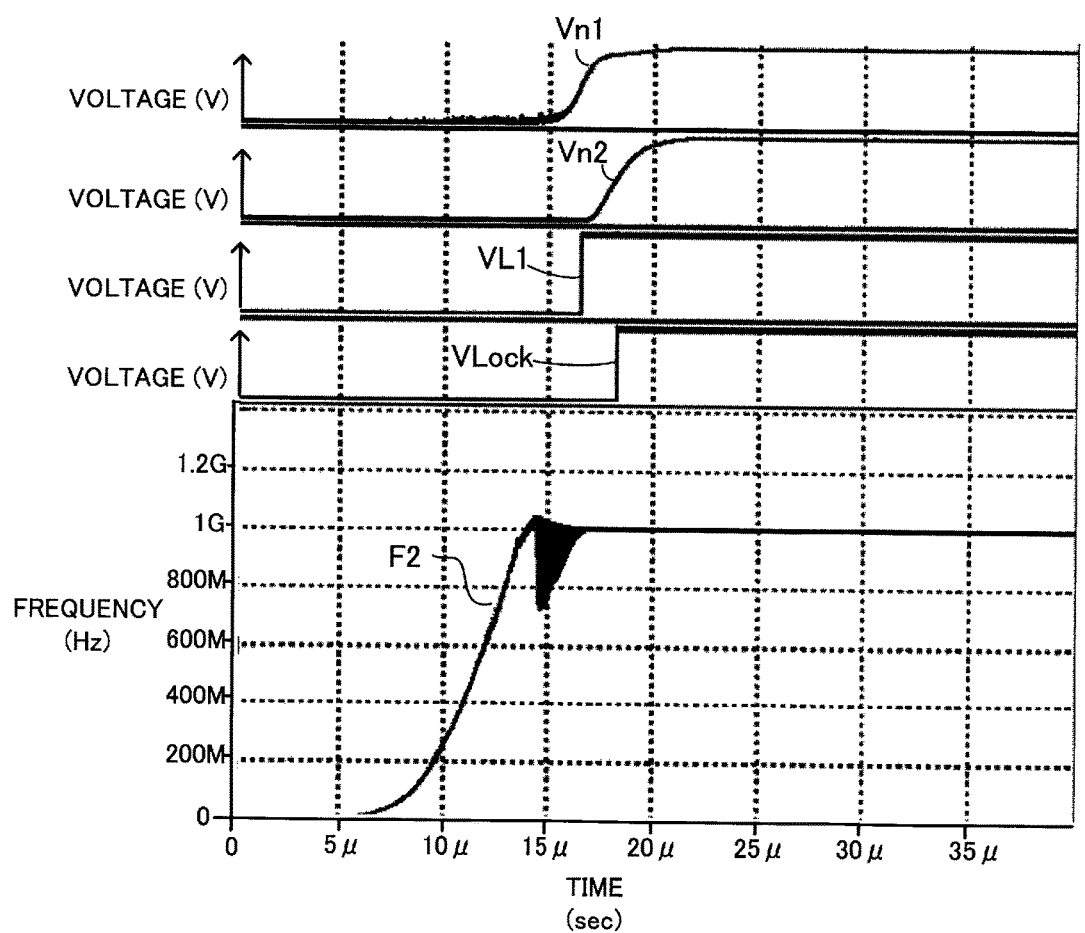
FIG. 17 depicts examples of signals of each element of the frequency overshoot suppression circuit and a frequency of an output signal of a VCO.

FIG. 17 depicts examples of the signals of each element of the frequency overshoot suppression circuit and the frequency of the output signal of the VCO.

FIG. 17 depicts, in addition to the voltage waveforms Vn1, Vn2, VL1, and VLock indicating the potentials of the nodes n1 and n2, the signal L1, and the lock signal Lock of the frequency overshoot suppression circuit 90 depicted in FIG. 16, an example waveform F2 of the frequency of the output signal X of the VCO 10. The horizontal axis represents time (in sec), and the vertical axis represents voltage (in V) or frequency (in Hz).

When the power supply voltage Vdd is supplied to the injection-locked PLL circuit 1a, for example, since the frequency of the feedback signal FB is lower than the frequency of the reference signal RCK at first, the logic level of the signal DN becomes the L level with the logic level of the signal UP at the H level more frequently. As a result, the control voltage Vcnt1 increases, and the frequency of the output signal X is increased as depicted by the waveform F2 by the frequency control function of the VCO 10.

Also, since the logic level of the signal DN becomes the L level with the logic level of the signal UP at the H level more frequently, the switches 91 and 92 of the frequency overshoot suppression circuit 90 in FIG. 16 switch on more frequently. For this reason, as indicated by the voltage waveform Vn1 in FIG. 17, the potential of the node n1 does not rise and the potential of the signal L1 also remains low as indicated by the voltage waveform VL1. Accordingly, even when the logic level of the signal UP becomes the H level, the AND circuit 97 supplies an output signal whose logic level is at the L level to the VCO 10. This means that the phase control function realized by the VCO 10 does not operate. That is, the phase control function is disabled.

When a time period of about 15 μsec has elapsed, the frequency of the reference signal RCK and the frequency of the feedback signal FB become substantially equal, so that the logic levels of the signals UP and DN become the L level more frequently. This means that the changes in the control voltage Vcnt1 become smaller, and the rate by which the frequency of the output signal X is increased by the frequency control function of the VCO 10 becomes smaller.

Since the logic levels of the signals UP and DN become the L level more frequently, the switches 92 and 93 of the frequency overshoot suppression circuit 90 in FIG. 16 are switched off more frequently. For this reason, as indicated by the voltage waveform Vn1 in FIG. 17, when the potential of the node n1 rises and the logic level becomes the H level (exceeding the threshold value), as indicated by the voltage waveform VL1, the logic level of the potential of the signal L1 rises to the H level. When the logic level of the potential of the signal L1 becomes the H level, the AND circuit 97 supplies an output signal whose logic level is at the H level to the VCO 10 every time the logic level of the signal UP becomes the H level. This means that the phase control function realized by the VCO 10 enters an enabled state.

After this, as indicated by the voltage waveform Vn2 in FIG. 17, the potential of the node n2 also rises, and when the logic level becomes the H level, as indicated by the voltage waveform VLock, the logic level of the lock signal Lock also becomes the H level.

At the start of the supplying of the power supply voltage Vdd to the injection-locked PLL circuit 1a, once the phase adjustment function is enabled and it becomes possible to change the active number of inverter circuits, overshoot may occur as depicted in FIG. 15. On the other hand, by providing the frequency overshoot suppression circuit 90 described above, it is possible to disable the phase adjustment function of the VCO 10 until the frequency of the reference signal RCK and the frequency of the feedback signal FB become substantially equal, thereby suppressing the occurrence of overshoot.

According to the disclosed injection-locked PLL circuits, it is possible to facilitate phase control.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A phase lock loop (PLL) circuit comprising:
a phase frequency detector circuit that outputs a detection signal based on a phase difference or a frequency difference between a reference signal and a feedback signal;
a charge pump circuit that outputs a pulse signal based on the detection signal;
a loop filter that outputs a control voltage based on the pulse signal;
a voltage-controlled oscillator circuit that includes a ring oscillator, in which a plurality of delay element units including a plurality of delay elements connected in parallel are connected in series in a ring, that receives the control voltage and controls a frequency of an output signal of the ring oscillator based on the control voltage, and that receives the detection signal and controls a phase of the output signal, independently of controlling the frequency of the output signal, by controlling an active number of the delay elements out of the plurality of delay elements based on the detection signal; and
a frequency divider circuit that divides the output signal to generate the feedback signal and outputs the feedback signal.

2. The PLL circuit according to claim 1, wherein
The voltage-controlled oscillator circuit includes a switch unit that sets, in a first state where a second phase of the feedback signal is a first phase difference behind a first phase of the reference signal and based on the detection signal, first delay elements out of the plurality of delay elements in an operating state for a first period corresponding to the first phase difference, and sets, in a second state where the second phase is a second phase difference ahead, of the first phase and based on the detection signal, second delay elements out of the plurality of delay elements in a non-operating state for a second period corresponding to the second phase difference.

3. The PLL circuit according to claim 2, wherein
the detection signal includes a first signal and a second signal,
the switch unit has a first switch unit connected to power supply terminals of the plurality of delay elements and a second switch unit connected to ground terminals of the plurality of delay elements,
the first switch unit and the second switch unit each include;

a first transistor that is controlled based on the first signal and a second transistor that is connected in series to the first transistor and is controlled based on the second signal, the first transistor and the second transistor being provided on a first current path, which supplies a current based on a power supply voltage to the first delay elements; and a third transistor that is controlled based on the first signal and a fourth transistor that is connected in parallel to the third transistor and is controlled based on the second signal, the third transistor and the fourth transistor being provided on a second current path, which supplies a current based on the power supply voltage to the second delay elements, in the first state, the first transistor and the second transistor turn on to supply the current to the first delay elements, and after the first period, the first transistor remains on and the second transistor changes from, on to off to cut off supplying of the current to the first delay elements, and in the second state, the third transistor and the fourth transistor turn off to cut off supplying of the current to the second delay elements, and after the second time, the third transistor remains off and the fourth transistor changes from off to on to supply the current to the second delay elements.

4. The PLL circuit according to claim 3, wherein
the first switch unit and the second switch unit each include a fifth transistor that is connected in series to the third transistor and is controlled based on the second signal and a sixth transistor that is connected in series to the fourth transistor and is controlled based on the first signal, and
in the first state, the third transistor and the fifth transistor are both on or the fourth transistor and the sixth transistor are both on, and in the second state, the third transistor, the fourth transistor, the fifth transistor, and the sixth transistor are all off.

5. The PLL circuit according to claim 3, wherein
the second switch unit includes a seventh transistor, which is connected to the first transistor or the second transistor and controls a magnitude of the current flowing to the first current path based on the control voltage, and an eighth transistor, which is connected to the third transistor or the fourth transistor and controls a magnitude of the current flowing to the second current path based on the control voltage, and
the voltage-controlled oscillator circuit includes a current supply circuit that supplies a first current to the first current path between the first transistor or the second transistor and the seventh transistor when the first delay elements are in the non-operating state, and supplies the first current to the second current path between the third transistor or the fourth transistor and the eighth transistor when the second delay elements are in the non-operating state.

6. The PLL circuit according to claim 3, wherein
the first switch unit and the second switch unit each include a ninth transistor that is provided on a third current path, which supplies a current to third delay elements out of the plurality of delay elements, and becomes on irrespective of the first signal and the second signal.

7. The PLL circuit according to claim 6, wherein
The voltage-controlled oscillator circuit includes:
a first capacitor that is connected to both ends of the first delay elements on the first current path;

a second capacitor that is connected to both ends of the second delay elements on the second current path; and a third capacitor that is connected to both ends of the third delay elements on the third current path.

8. The PLL circuit according to claim 1, further comprising:

a frequency overshoot suppression circuit that includes a capacitor, whose held voltage rises as a second frequency of the feedback signal approaches a first frequency of the reference signal, and that invalidates the detection signal supplied to the voltage-controlled oscillator circuit until the held voltage exceeds a threshold value.

* * * * *